(12) United States Patent
Krauss et al.

(10) Patent No.: US 7,981,257 B2
(45) Date of Patent: Jul. 19, 2011

(54) CURRENT-BASED METHOD AND APPARATUS FOR DETECTING AND CLASSIFYING ARCS

(75) Inventors: Alan F. Krauss, Raleigh, NC (US); Raymond W. Harris, Youngsville, NC (US); Paul R. Buda, Raleigh, NC (US)

(73) Assignee: Schneider Electric USA, Inc., Palatine, IL (US)

( * ) Notice: Subject to any disclaimer, the term of this patent is extended or adjusted under 35 U.S.C. 154(b) by 1023 days.

(21) Appl. No.: 11/687,615

(22) Filed: Mar. 16, 2007

(65) Prior Publication Data

US 2008/0021664 A1    Jan. 24, 2008

Related U.S. Application Data

(63) Continuation-in-part of application No. 10/769,023, filed on Jan. 30, 2004, now abandoned, which is a continuation of application No. 10/121,445, filed on Apr. 12, 2002, now Pat. No. 6,736,944.

(60) Provisional application No. 60/783,346, filed on Mar. 17, 2006.

(51) Int. Cl.
   *C23C 14/34* (2006.01)
(52) U.S. Cl. ......... 204/192.12; 204/192.13; 204/298.03; 204/298.08
(58) Field of Classification Search ............. 204/192.12, 204/192.13, 298.03, 298.08
See application file for complete search history.

(56) References Cited

U.S. PATENT DOCUMENTS

| | | |
|---|---|---|
| 4,193,070 A | 3/1980 | Oppel |
| 4,700,315 A | 10/1987 | Blackburn et al. |
| 5,192,894 A | 3/1993 | Teschner |
| 5,241,152 A | 8/1993 | Anderson et al. |
| 5,611,899 A | 3/1997 | Maass |
| 5,993,615 A * | 11/1999 | Abry et al. ............... 204/192.13 |
| 6,332,961 B1 | 12/2001 | Johnson et al. |
| 6,621,674 B1 | 9/2003 | Zahringer et al. |
| 6,736,944 B2 | 5/2004 | Buda |
| 7,334,477 B1 | 2/2008 | Pirkle |

(Continued)

FOREIGN PATENT DOCUMENTS

WO    9914699    3/1999

(Continued)

OTHER PUBLICATIONS

International Preliminary Report on Patentability and Written Opinion for PCT/US2007/064248 dated Sep. 23, 2008.

(Continued)

*Primary Examiner* — Rodney G McDonald

(57) ABSTRACT

An apparatus and technique are provided for generating a plasma using a power supply circuit and arc detection arrangement. The power supply circuit has a cathode enclosed in a chamber, and is adapted to generate a power-related parameter. The arc detection arrangement is communicatively coupled to the power supply circuit and adapted to assess the severity of arcing in the chamber by comparing the power-related parameter to at least one threshold. According to various implementations, arc occurrences, arcing duration, intensity and/or energy are measured responsive to comparing the power-related parameter to the at least one threshold. According to further implementations, the above-mentioned measured quantities are accumulated and/or further processed. An apparatus and method are also provided for detecting arc events when the current spikes above a threshold level. The method and apparatus is also for classifying the arc events based on the voltage and current signals and the duration each is beyond a threshold value.

34 Claims, 19 Drawing Sheets

U.S. PATENT DOCUMENTS

| | | |
|---|---|---|
| 2004/0182697 A1 | 9/2004 | Buda |
| 2005/0040144 A1 | 2/2005 | Sellers et al. |
| 2005/0212450 A1 | 9/2005 | Martinez |
| 2008/0021664 A1 | 1/2008 | Krauss et al. |
| 2008/0034092 A1 | 3/2008 | Krauss |
| 2008/0133154 A1 | 6/2008 | Krauss |

FOREIGN PATENT DOCUMENTS

| | | |
|---|---|---|
| WO | 9914934 | 3/1999 |
| WO | 0055697 | 9/2000 |
| WO | 0150704 | 7/2001 |
| WO | 03088445 | 10/2003 |
| WO | 04001094 | 12/2003 |
| WO | 2004003968 | 1/2004 |
| WO | 2008034092 | 3/2008 |
| WO | 2008133154 | 6/2008 |

OTHER PUBLICATIONS

International Search Report for PCT/US2007/078548 dated Mar. 5, 2008.

International Search Report and Written Opinion for PCT/US2007/078548 dated May 9, 2008.

International Search Report for PCT/US03/11301 dated Dec. 10, 2003.

International Search Report for PCT/US03/11293 dated Aug. 5, 2004.

Dimitri, Industrial Computing Society: "High Performance DSP Based Motion Control for PLC's with VME Architecture", Proceedings of the Industrial Computing Conference, Oct. 27-31, 1991, vol. 1, Conf. 1, pp. 215-237.

Anonymous, "ACC-28A 4-Channel Analog Converter Board", Internet Article, 'Online!, Sep. 25, 2001, retrieved from the Internet: <URL:http://web.archive.org/web/2011114075751/www.deltatau.com/Products/pmacaccs/ACC28A.htm>, retrieved on Aug. 3, 2004.

Anonymous, "Digital Signal processor Control Board DS200DSPCG_A_", Internet Article, 'Online!, Aug. 3, 2001, retrieved from the Internet: <URL:http://www.geindustrial.com/products/manuals/GEI-100220.pdf>, retrieved Aug. 3, 2004, pp. 1-4.

International Search Report for PCT/US2007/064248 dated Aug. 7, 2007.

International Search Report and Written Opinion for PCT/US2009/047460, dated Sep. 9, 2009.

Office Action in CN2007/80018007.4, dated Mar. 22, 2010.

\* cited by examiner

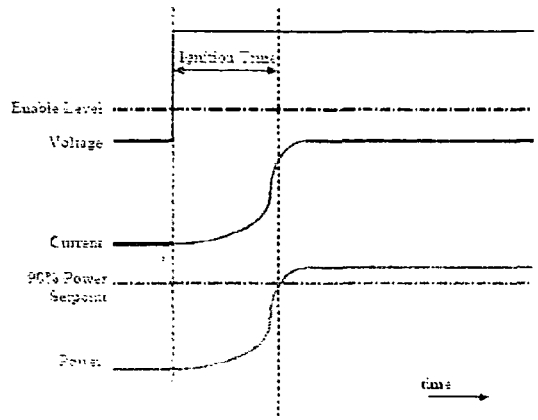

FIGURE 21

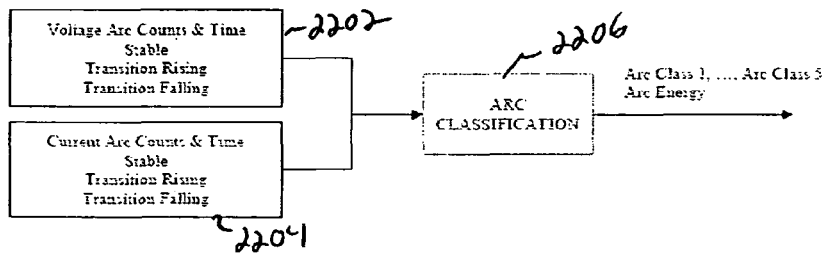

FIGURE 22

| Arc Class | Event Type | Description |
|---|---|---|
| 1 | True Arc | coincidental voltage drop(s) and current spike(s) - signature of true arcing conditions |
| 2 | Mini Power Loss or Micro-Arc | one or more voltage drops, cumulative Arc Time < 500 µs - small power loss or micro-arc seen only on voltage channel |
| 3 | Larger Power Loss | one or more voltage drops, with cumulative Arc Time ≥ 500 µs - indicative of a brief loss of power by the power supply |
| 4 | Mini Current Spike | one or more spikes in current, cumulative Arc Time < 500 µs - may indicate arcing similar to that seen in Arc Class 1, without accompanying drop in voltage significant enough to cross the Arc Threshold |
| 5 | Larger Current Spike | one or more spikes in current, with cumulative Arc Time ≥ 500 µs - rarely seen and unusual process condition |

FIGURE 23

CURRENT-BASED METHOD AND APPARATUS FOR DETECTING AND CLASSIFYING ARCS

CROSS-REFERENCE TO RELATED APPLICATIONS

The present invention is a continuation-in-part of U.S. patent application Ser. No. 10/769,023, filed Jan. 30, 2004, which is a continuation of U.S. patent application Ser. No. 10/121,445, filed Apr. 12, 2002. The present invention also claims the benefit of priority of U.S. Provisional Patent Application No. 60/783,346 for "Current-Based Method and Apparatus for Detecting and Classifying Arcs" filed Mar. 17, 2006.

TECHNICAL FIELD

The invention generally relates to a method and apparatus for detecting and classifying arcs in a device, and more particularly, to a method and apparatus for detecting and classifying arcs in a physical vapor deposition process by examining the current and voltage, and timing the duration each goes beyond one or more threshold values.

BACKGROUND OF THE INVENTION

Sputtering deposition, such as Physical Vapor Deposition (PVD), is a process for depositing thin, highly uniform layers of a variety of materials onto many objects, for example depositing a metal layer over a substrate such as a wafer used in forming integrated circuits (ICs). In a direct current (DC) sputtering process, the material to be deposited (target) and the substrate to accept the deposited material (wafer) are placed in a special vacuum chamber. The vacuum chamber is evacuated and subsequently filled with an inert gas, such as argon, at low pressure.

The wafer is electrically connected to (or in the vicinity of) the anode of a high voltage power supply, the anode being generally at or near earth potential. The walls of the sputtering chamber are also placed at this potential. A target, typically formed of metal, is placed in the vacuum chamber and electrically connected to the cathode of the high voltage power supply. Alternately, the target is formed of an insulating material. An electric field is generated between the target (cathode) and an anode by the power supply. When a potential between the anode and cathode reaches 200-400 volts, a glow discharge is established in the inert gas in the superconducting region of the well known Paschen curve.

When a glow discharge operates in the superconducting region of the Paschen curve, valence electrons are torn from the gas and flow toward the anode (ground), while the resulting positively-charged ionized gas atoms (i.e., plasma) are accelerated across the potential of the electric field and impact the cathode (target) with sufficient energy to cause molecules of the target material to be physically separated from the target, or "sputtered." The ejected atoms travel virtually unimpeded through the low pressure gas and plasma, some of which land on the substrate and form a coating of target material on the substrate. The result, under ideal conditions, is a uniform cloud of target molecules in the chamber, leaving a resultant deposition of uniform thickness on the chamber and its contents (e.g., the wafer). This coating is generally isotropic, conforming to the shape of the objects in the chamber. A natural consequence of this action is that the target material wears or becomes thinner as more material is sputtered.

The processing of integrated circuits is reliant on the uniformity of coating resulting from the glow discharge process. The vacuum chamber containing the discharge and target material is carefully designed to attempt to maintain a uniform electric field, and a glow discharge is, in principle, sustainable over a range of electric field strengths, again in accordance with the Paschen curve. However, uniformity of electric field cannot be maintained perfectly and the uniformity of the glow discharge and henceforth wear on the target is influenced by a number of factors, including thermal currents generated in the chamber and other mechanical anomalies, such as target misalignment. To compensate for these anomalies, commercial PVD sputtering machines often incorporate a mechanism to rotate a large magnet at constant speed above the target. This rotation serves to disturb the electromagnetic field in the chamber, focusing the region in which the plasma impinges upon the target on a smaller, moving area. Maintaining a constant power in the chamber while rotating the magnet at a constant rate improves the uniformity of wear of the target, increasing target life and generally maintaining a more uniform distribution of molecular target material in the chamber. As the magnet rotates above the target, local geometric, thermal and other variations cause the lumped electrical impedance of the chamber to change. With the power supply configured to deliver a constant power to the glow discharge, the relation between chamber voltage and current required to maintain constant power changes in accordance with the variation in impedance. If one monitors the chamber voltage and current, a clear periodic variation in the chamber voltage and current can be observed, with the period equal to that of the rotational period of the magnet.

Even with the rotating magnet mechanism in place to attempt to stabilize the glow discharge, certain conditions can result in a local concentration of the electric field causing the glow discharge to pass from the superconducting region of the Paschen curve into the arcing region. Arcing during PVD results in an unintended low impedance path from the anode to the target through electrons or ions in the plasma, the unintended path generally including ground, with the arcing being caused by factors such as contamination (i.e., inclusions) of the target material, inclusions within the structure (e.g., surface) of the target, improper target alignment (e.g., misalignment of cathode and anode), vacuum leaks, and/or contamination from other sources such as vacuum grease. Target contaminants include $SiO_2$ or $Al_2O_3$.

Arcing during PVD is one cause of yield-reducing defects in forming integrated circuits on semiconductor wafers. While normal metal deposition is typically less than 1 micron thick, arcing causes a locally thicker deposition of metal on the wafer. When an arc occurs, the energy of the electromagnetic field of the chamber is focused on a smaller region of the target than intended (e.g., the neighborhood of the target defect), which can dislodge a solid piece of the target. The dislodged solid piece of target material may be large relative to the thickness of the uniform coating expected on the wafer, and if a large piece falls upon the wafer, it may cause a defect in the integrated circuit being formed at that location. Subsequent photolithography processing etches away various areas of the deposited metal layer, leaving metal conductor paths according to desired circuit patterns. Because arcing results in a localized defect (area) having a greater thickness than the surrounding metal, the defect area may not be thoroughly etched in the subsequent processing, resulting in an unintended circuit path (i.e., short) on the chip. A semiconductor chip has multiple metal layers separated by insulator layers, each of the metal levels formed by depositing, patterning and etching a metal layer as described above. A local defect in one layer can also distort an overlying pattern imaged onto the wafer in a subsequent photolithography step, and thus result in a defect in an overlying layer.

Manufacturing a wafer of modern integrated circuits can involve well over a thousand individual processing steps, the value of the wafer and consequently each individual integrated circuit die increasing with each processing step. Arcing in a PVD sputtering apparatus used to process wafers into integrated circuits can render portions of the wafer useless for its intended purpose, thereby increasing manufacturing costs. Using target materials free of arc-causing inclusions is one way of minimizing integrated circuit fabrication defects; however, target material may become contaminated during its manufacture or thereafter. Discovering target contamination prior to sputtering operations so as to prevent arcing defects is costly, both in terms of time and expense. Not discovering arcing defects in a timely manner is similarly costly in terms of random yield loss, for example by the manufacturer operating a deposition chamber until the target inclusion causing the arcing is sputtered through. Furthermore, when a solid piece of the target is dislodged during an arc, the surface of the target may be further damaged and the potential for future arcing in that neighborhood increases.

Absent real-time arc detection, corrective action is dependent upon the availability of parametric data. It is costly to measure the number of defective layers caused by arcing, for example via electrical tests designed to reveal shorts or by scanning the surface of wafers with a laser after metal deposition. These tests take time to run, during which production is delayed, or undetected yield loss occurs for an extended time. Since a defect such as a short at any level can impact integrated circuit functionality, it is desirable to avoid damage resulting from arcing during sputtering deposition.

Accordingly, real-time arc detection permits faster identification of sources of yield loss, and detection of incipient faults within the processing tool or target itself, both resulting in more efficient integrated circuit fabrication applications.

As discussed above, arcs can throw solid material into the chamber, and it can be assumed that any such piece of solid material landing on a wafer of integrated circuits has a high probability of damaging at least one integrated circuit. One statistic indicative of the potential damage to a wafer of integrated circuits is therefore the number of arcs that occur during a process step. It is also reasonable to assume that the expected damage caused by an individual arc to an integrated circuit wafer is a monotonically increasing function of the energy delivered to the arc, since a violent arc is likely to spread more solid material over a wider area than a relatively "mild" arc. A system that can estimate both the number of arcs occurring during a PVD sputtering process step as well as the severity of the arcs in real time is therefore a valuable tool in estimating the potential damage caused in a particular PVD sputtering step.

It is well known that when an arc occurs in a glow discharge process, the magnitude of the lumped impedance of the chamber decreases rapidly. When this occurs, the presence of series inductance in the driving point impedance of the power delivery system, comprising power supply and interconnection means, causes a rapid drop in the magnitude of observed voltage between the anode and cathode of the chamber. Observing the chamber voltage and comparing it against a fixed threshold is a common means of detecting the presence of an arc and one can readily accomplish this by attaching a common oscilloscope to the cathode, with the ground of the oscilloscope probe attached to the chamber. Having an estimate of the average chamber processing voltage, which one can obtain visually by observing the voltage using a free running oscilloscope, one can set the trigger point of the oscilloscope at a voltage greater than the expected voltage (the voltages observed in such a manner are negative with respect to the oscilloscope reference). When the oscilloscope triggers, the resulting voltage waveform due to the arc can be observed and one can also simultaneously observe the current by means of an appropriate current probe. Systems have been developed that emulate this method of detecting arcs and which count the number of occurrences so obtained over the course of a processing step. A known shortcoming of this approach is that the fixed trigger level must be set conservatively, as the chamber voltage varies periodically with magnet rotation as discussed above, as well as varying over the course of a PVD processing step due to thermal and other considerations. As such, such a system may miss arcs of small magnitude, which nonetheless cause damage. A system that can more closely follow the actual, instantaneous expected chamber voltage would permit these arcs to be detected more readily, providing a more accurate estimate of damage.

In the PVD process used to produce integrated circuits, arcing conditions lasting less than 1 microsecond are commonly observed. These short duration arcs are commonly called microarcs. Electronically controlled analog or switching power supplies cannot react to this rapid change in chamber impedance during a microarc. As a natural consequence of the series inductance, the power supply delivers a near constant current to the chamber during a microarc. Assuming that during an arcing condition, all energy delivered by the power supply is focused on the arc, the energy delivered to an individual arc can be estimated by the integral of the product of the power supply voltage times the (assumed constant) current over the interval of the arc. Again, digital oscilloscopes exist that permit the capture of both the chamber voltage and current waveforms during an arcing condition. Computer software, such as Tektronix "Wavestar" software, exists that can permit a digitally stored waveform to be uploaded to a computer, where the captured voltage and current waveforms can be subsequently multiplied point by point to compute instantaneous power and that power waveform integrated over the duration of the arc to determine the overall energy delivered by an arc.

While useful for gaining an understanding of the arcing phenomenon in PVD applications, this method of computing arcs and arc energy using an oscilloscope and a post processing computer is of little value in production applications. Even modern handheld oscilloscopes are relatively bulky instruments, and real estate in an integrated circuit clean room is extremely valuable. A stand alone post processing computer also takes up valuable floor space and would likely need to be located outside the clean room and connected to the oscilloscope by a network, adding latency in the transfer of data between the oscilloscope and computer. Furthermore, there is no means to tell a-priori the duration of an individual arc, or the frequency at which they might occur, leaving the problem of exactly how to set the controls of the oscilloscope. Oscilloscopes also have limited waveform storage capability, and therefore prone to losing information at the times in which it is needed most, when there is much arcing activity during a process. A system so configured would render real time control and decision making impractical.

Various aspects of the present invention address the above-mentioned deficiencies and also provide for arc detection methods and arrangements that are useful for other applications as well.

In addition to the problems discussed, when counting arcs only as voltage threshold violations, some information may be lost or obscured if the power supply responds to the arcs by reducing delivered power. The result of reducing power is a dip in both the voltage and the current.

The present invention is provided to solve the problems discussed above and other problems, and to provide advantages and aspects not provided by prior methods or systems of this type. A full discussion of the features and advantages of the present invention is deferred to the following detailed description, which proceeds with reference to the accompanying drawings.

SUMMARY OF THE INVENTION

According to one aspect of the invention, the present invention is directed to an apparatus and method for detecting arcs during plasma generation that addresses the above-mentioned challenges and that provides a feedback method for controlling film deposition processes. The present invention is exemplified in a number of implementations and applications, some of which are summarized below.

According to one example embodiment of the present invention, a plasma generation apparatus includes an arc detection arrangement communicatively coupled to a power supply circuit. The power supply circuit has a cathode enclosed in a chamber, and is adapted to generate a power-related parameter. The arc detection arrangement is adapted to assess the severity of arcing in the chamber by comparing the power-related parameter to at least one threshold.

According to other aspects of the present invention, the arc detection arrangement is adapted to estimate arc intensity, arc duration and/or arc energy.

According to another example embodiment of the present invention, the arc detection arrangement is implemented using a programmable logic controller (PLC).

According to another example embodiment of the present invention, the PLC operates in concert with the arc detection arrangement to compute an adaptive arc threshold value responsive to normal variations in the impedance of the PVD chamber, said real time adaptive arc threshold value communicated by the PLC to the arc detection apparatus in near real time.

According to another example embodiment of the present invention, the adaptive arc threshold value responsive to normal variations in the impedance of the PVD chamber is computed by the arc detection arrangement itself, with statistical data regarding both arcing activity and the adaptive arc threshold function communicated to the PLC in near real time.

Actual micro-arcs (e.g., as captured on an oscilloscope) show a rapid decrease (followed by a recovery to a nominal value) in voltage magnitude and simultaneously, a rapid increase (also followed by a recovery to a nominal value) in current magnitude. Accordingly, looking at the current level for spikes, and looking at the voltage level for simultaneous decreases greatly increase the confidence level or success rate of "true" arc detection. The present invention provides embodiments of a method and apparatus for detecting such arc events, and for detecting and classifying other arc events.

According to another aspect of the present invention, the output of a current transducer is fed into a programmable threshold comparator of an arc detection unit. In this embodiment, arc events are measured by the arc detection unit in terms of how many times current makes an excursion above a threshold value and in terms of the elapsed time for which the current is above the threshold value. Additional information regarding the severity of the arc may be obtained by placing more than one threshold value (each at a different level) above the nominal operating point and comparing arc event counts and elapsed time for the different threshold levels.

According to another aspect of the invention, the apparatus includes logic to classify arc events based on combined data from both the voltage and current channels of a power supply interface. Additionally, the apparatus computes scan energy and arc energy for events occurring in a particular class of arc events.

According to an example embodiment of the present invention a method of detecting and classifying arcs in a physical vapor deposition process is provided. The method comprises monitoring a power supply voltage and current of a plasma generation apparatus. Based on the monitoring the method includes detecting each instance when the voltage drops below a predetermined first voltage threshold, timing the duration of each instance the voltage drops below the predetermined first voltage threshold, detecting each instance the current spikes above a predetermined first current threshold, and timing the duration of each instance the current spikes above the predetermined first current threshold. The duration of voltage drops and the duration of current spikes can be measured in clock cycles. The method then comprises classifying each instance the voltage drops below the predetermined first threshold and each instance the current spikes above the predetermined first current threshold as an arc event. Accordingly, arc events can occur from either a detected voltage drop and/or a current spike.

The method further includes determining whether the power supply voltage is in one of a stable mode, a rising transition mode or a falling transition mode. Arc events may be counted or otherwise analyzed separately for each of these categories. For example, the method can include maintaining a count of arc events and corresponding durations occurring when the voltage is in a stable mode, maintaining a count of arc events and corresponding durations occurring when the voltage is in a rising transition mode; and, maintaining a count of arc events and corresponding durations occurring when the voltage is in a falling transition mode.

The arc events can be put into different classifications based on the data acquired from monitoring the power supply voltage and current of the plasma generation apparatus. According to one example, during a predetermined time period, such as a scanning cycle of a PLC or other computing device or logic arrangement or circuitry, the method includes assigning arc event instances where a voltage drop and a current spike are coincidental a first classification. Additionally, the method further includes assigning arc event instances of one or more voltage drops without a corresponding coincidental current spike having a cumulative duration less than a predetermined time a second classification and assigning arc event instances of one or more voltage drops without a corresponding coincidental current spike having a cumulative duration greater than a predetermined time a third classification. With respect to sensed current arc events, the method similarly includes assigning arc event instances of one or more current spikes without a corresponding coincidental voltage drop having a cumulative duration less than a predetermined time a fourth classification, and, assigning arc event instances of one or more current spikes without a corresponding coincidental voltage drop having a cumulative duration greater than a predetermined time a fifth classification. For each of the various classifications, the method can include calculating the scan energy for the designated arc events Detecting an arc event often results in the power supply dropping (i.e., entering into a falling transition mode). To avoid including or counting transients resulting while in this falling transition mode as being in a stable mode, the method further includes disabling detecting a voltage drop below a predetermined first threshold for a transition hold period after each detection of a voltage drop below the predetermined first threshold, and disabling detecting a current spike above a predetermined first threshold for a transition hold period after each detection of a current spike above the predetermined first threshold. The information can still be kept if further analysis is done for the transition modes.

The method also accommodates the slow changes (i.e., relative to arc events) to the supply voltage occurring during a sputtering deposition process in the stable mode. In this regard, the method further includes adjusting the predetermined first voltage threshold during a scanning cycle to track slow changes in the supply voltage.

According to one example, the method could be set up to provide additional information regarding the severity of arcing. In this regard, the method can include detecting each arc event instance where the voltage drops below a predetermined second voltage threshold, and detecting each arc event instance the current spikes above a predetermined second current threshold. Additional threshold values can be similarly be utilized to provide even more precise information.

According to another example of the invention, a method of determining an arc event in a plasma generation apparatus comprises the steps of monitoring a power supply current, obtaining a current signal indicative of the monitored current, and, determining if the current signal is beyond a predetermined current threshold value indicative of an arc event. Similarly, the method can further comprise monitoring a voltage of the power supply. obtaining a voltage signal indicative of the monitored voltage, and, determining if the voltage signal is beyond a predetermined voltage threshold value indicative of an arc event. Additionally, for the method can include timing the duration of each arc event occurring when the current is beyond the predetermined current threshold value and when the voltage is beyond the predetermined voltage threshold value. Again, each arc event can be classified, and the scan energy and arc energy can be calculated.

According to yet another example of the invention a method for detecting arcs in a plasma generation apparatus comprises providing a supply of power to the plasma generation apparatus to create an ionized gas between a target and a wafer, providing an interface for detecting a supply voltage and a supply current, comparing the voltage to a voltage threshold value at a set frequency and, comparing the current to a current threshold value at the set frequency. Additionally, the method comprises determining if an arc event occurred from the comparing of the voltage to the voltage threshold value and from the comparing of the current to the current threshold value.

The method further includes delaying comparing the voltage to the voltage threshold value and the current to the current threshold value for a transition delay period after each detection of an arc event. This provides a more accurate arc event count for the stable mode.

Additionally, the method can include looking at other parameters (than voltage or current threshold crossings) to provide further information of any arcing. This can include further information regarding the severity of the arc events. According to one example, the method can further include the steps of generating a power-related parameter, comparing the power-related parameter to at least one threshold to determine the severity of arcing in the plasma generation apparatus and, measuring arc duration responsive to comparing the power-related parameter to the at least one threshold.

According to yet another aspect of the invention, an apparatus for detecting an arc event in a plasma generation chamber is provided. The apparatus comprises a power supply interface module configured for detecting a power supply voltage and current applied to the plasma generation chamber and, an arc detection unit communicatively coupled to the power supply interface module, the arc detection unit including a threshold comparator circuit arranged to compare the voltage to a first voltage threshold value for determining if an arc event occurs and compare the current to a first current threshold value for determining if an arc event occurs. The arc detection unit preferably includes a digital signal processor (DSP) with an analog to digital converter.

Additionally, the arc detection unit of the apparatus includes or is coupled to logic circuitry arranged to make a determination of an arc event based on an output of the threshold comparator circuit. The logic circuitry can be a programmable logic controller (PLC) or other similar computing device. Moreover, in some instances, the DSP could include logic to perform some or all of the functions disclosed herein.

The threshold comparator circuit is preferably programmable to enable a user to set an initial voltage threshold value and an initial current threshold value. Additionally, separate components can be used for the voltage and the current. The threshold comparator circuit is preferably an analog circuit. The threshold level is generated in the DSP and the arc signal is converted to digital by an analog to digital converter in the DSP. The DSP contains firmware whose parameters are software controlled by the PLC or other logic circuitry or arrangement.

The logic circuitry of the apparatus is utilized for a number of functions. For example, the logic circuitry is arranged to determined if the voltage is in one of a stable mode, a rising transition mode and a falling transition mode. Additionally, the logic circuitry is arranged to maintain a count of arc events occurring when the voltage is in a stable mode, maintain a count of arc events when the voltage is in a rising transition mode, and maintain a count of arc events when the voltage is in a falling transition mode. The logic circuitry is also arranged to determine the duration of an arc event based on the voltage dropping below the first voltage threshold value, and the duration of an arc event based on the current spiking above the first current threshold value. The duration is typically measured in clock cycles which—based on the frequency—can be converted to time units.

The logic circuitry is further arranged to classify arc events based on the output of the threshold comparator circuit and the duration of each arc event. The classification is for a predetermined time cycle, such as a PLC scan cycle. The logic circuitry can be configured, for example, to assign arc event instances where a voltage drop and current spike are coincidental a first classification, assign arc event instances of one or more voltage drops without a corresponding coincidental current spike having a cumulative duration less than a first predetermined time period a second classification, assign arc event instances of one or more voltage drops without a corresponding coincidental current spike having a duration greater than the first predetermined time period a third classification, assign arc event instance of one or more current spikes without a corresponding coincidental voltage drop having a cumulative duration less than a second predetermined time period a fourth classification, and assign arc event instance of one or more current spikes without a corresponding coincidental voltage drop having a cumulative duration greater than the second predetermined time period a fifth classification.

The logic circuitry can also compute various parameters of the arcing. This can include scan energy and arc energy.

According to a further aspect of the invention, an apparatus for detecting arcs in a plasma generation apparatus comprises an arc detection unit communicatively coupled to a current of a power supply. The arc detection unit includes a threshold comparator circuit configured to compare the current to a first current threshold value, and logic circuitry arranged to detect an arc event based on a comparison of the current to the current threshold value in the threshold comparator circuit.

The arc detection unit can also be communicatively coupled to a voltage of the power supply. In this instance, the threshold comparator circuit is further configured to compare the voltage to a first voltage threshold value and the logic circuitry is further arranged to detect an arc event based on a comparison of the voltage to the voltage threshold value in the threshold comparator circuit.

The arc detection unit further comprises a timing circuit arranged to compute a duration of a detected arc event based on the comparison of the current and the current threshold value. The timing circuit is also arranged to compute a duration of a detected arc event based on the comparison of the voltage and the voltage threshold value.

The threshold comparator circuit can be configured to compare the current to a second current threshold value (or a plurality of additional threshold levels) different than the first current threshold value. The threshold comparator circuit can similarly be configured to compare the voltage to one or more additional threshold values. The duration the current or voltage is beyond a particular threshold value can be computed for each of the threshold values.

According to yet a further aspect of the invention, an apparatus for detecting an arc event in a plasma generation apparatus comprises a power supply interface module communicatively coupled to a voltage and current of a power supply for the plasma generation apparatus, an arc detection unit having a first channel for receiving a signal indicative of the voltage and a second channel for receiving a signal indicative of the current; and, and a threshold comparator circuit in the arc detection unit arranged to compare the voltage signal to a voltage threshold value and to compare the current signal to a current threshold value.

The apparatus can further comprise logic circuitry to determine if an arc event occurred based on the output of the threshold comparator circuit. The logic circuitry can also be arranged to compute a parameter-related to the power supplied to the plasma generation apparatus. The logic circuitry can also compare the power related parameter to at least one threshold to determine the severity of arcing in the plasma generation apparatus.

The present invention enhances the ability to determine in real-time when arcing is occurring so that corrective action may be taken. This can improve wafer yield and reduce defects.

In some instances, an apparatus looking primarily at the voltage and power, would count both the arc and the resultant voltage dip (i.e., resulting from a reduced power supply response to the arc), which would produce an inaccurate count. The present invention further provides a method and apparatus for more accurately counting and classifying arcs. That is, by counting arcs as current threshold violations, even in the presence of power reduction events, the arcs are more accurately represented in arc counts and time statistics.

Other features and advantages of the invention will be apparent from the following specification taken in conjunction with the following drawings.

BRIEF DESCRIPTION OF THE DRAWINGS

To understand the present invention, it will now be described by way of example, with reference to the accompanying drawings in which:

FIG. 21 is a plot of the ignition time;

FIG. 22 is a block diagram of the arc classification;

FIG. 23 is a table of the arc classification;

Figure 1:
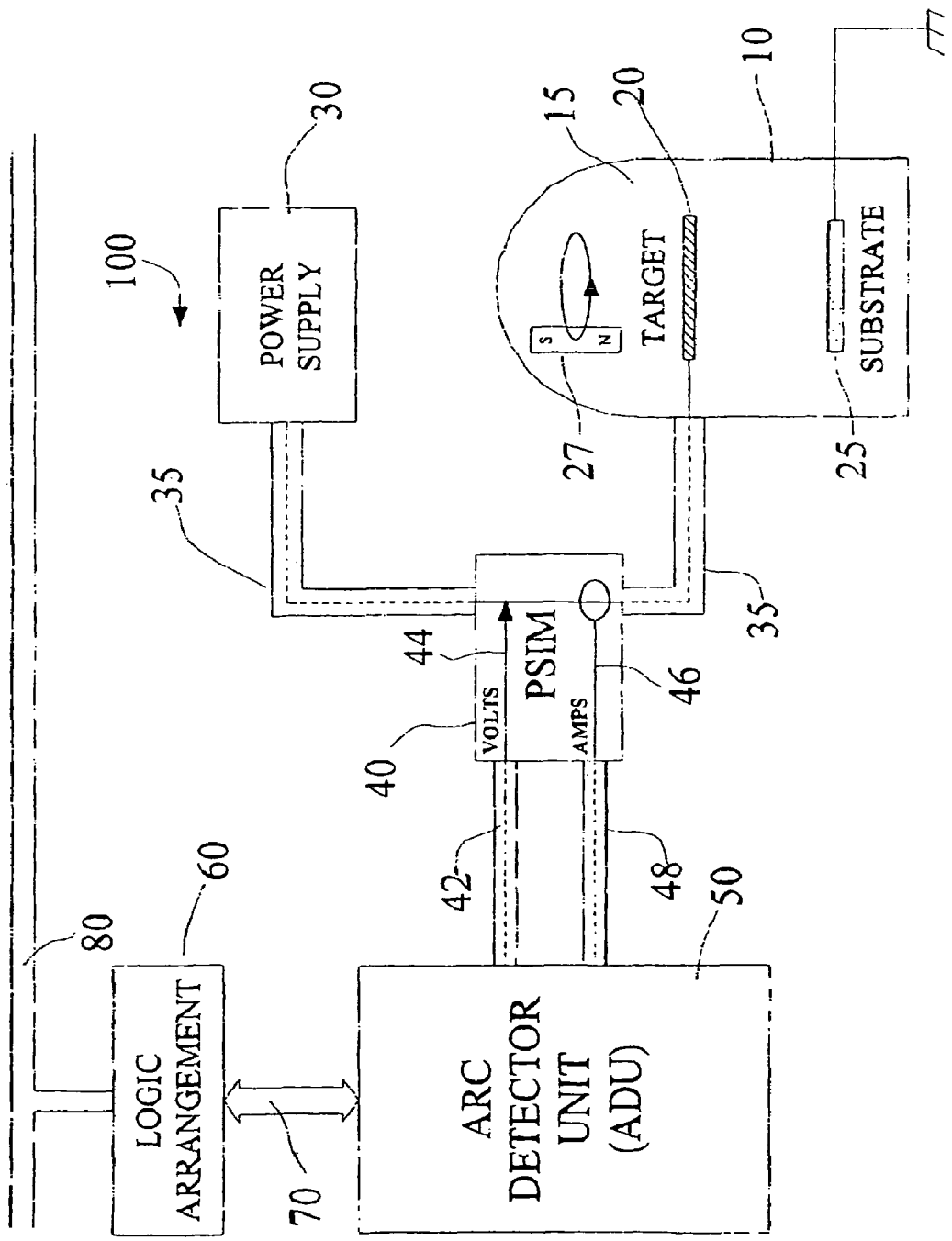
FIG. 1 is a block diagram illustrating one example embodiment of an arc detection arrangement, according to the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

While this invention is susceptible of embodiments in many different forms, there is shown in the drawings and will herein be described in detail preferred embodiments of the invention with the understanding that the present disclosure is to be considered as an exemplification of the principles of the invention and is not intended to limit the broad aspect of the invention to the embodiments illustrated.

The present invention is believed to be applicable to a variety of different types of plasma generation applications, and has been found to be particularly useful for film deposition applications, the latter benefiting from a technique for responding to detected arcs during the generation of a plasma environment. Example embodiments described herein involve PVD sputtering techniques; however, the present invention can be implemented in connection with a variety of systems, including those using plasma-generating techniques such as plasma etching or Plasma Enhanced Chemical Vapor Deposition system (PECVD).

While arcing events may never be wholly avoided, obtaining certain detailed data regarding the severity of arcs occurring during a sputtering process provides useful information from which compensatory-process decisions can be made. For instance, through real-time detection of a single arc of small magnitude, one might suspect the presence of minimal defects due to arcing on an affected integrated circuit die. Conversely, from real-time detection of a large quantity of arcs, or arcs of high severity, one might suspect the presence of many defects, perhaps even reach a conclusion that an entire processing step is defective. Real time arc detection according to the present invention permits manufacturing decisions to occur in real time, or nearly so. For example, where a processing step is suspected as being defective due to detection of significant quantity or severity of arcing, the PVD process step may be terminated before further damage can occur. At the end of a PVD processing step, whether completed normally or terminated per above a decision to repair or discard the wafer can be made before further processing steps are initiated. If an initial processing step is deemed defective through real-time detection of significant arcing, and processing costs to the present stage of manufacturing the wafer are low, it may be cost-effective to discard the wafer. If arcing occurs during a latter processing step, for which the cost of processing a wafer to the affected step is high, it may be cost-effective to chemically etch or physically polish the wafer to remove the defective deposition layer and re-process the wafer. Additionally, detection of arcing activity on a wafer to wafer basis of an individual PVD system in which no or minimal previous arcing activity is observed may be indicative of the development of an incipient equipment fault condition that can be corrected by scheduling appropriate equipment maintenance during scheduled equipment inactivity. The key is timely recognition of the increased probability of defects due to arcing.

For a particular PVD system, the power supply to drive the process attempts to regulate power delivered to the chamber. The impedance of the chamber elements, including the anode, cathode and chamber environment between the anode and cathode, is in series with the impedance of the plasma-generating power supply circuit. The relation between voltage and current to maintain a constant power in a plasma is dependent upon the impedance of the chamber elements, including the conductivity of the particular target material itself which is subject to change as a result of the sputtering process.

When an arc develops in the sputtering chamber, the magnitude of the impedance of the chamber drops rapidly, thereby changing the impedance of the plasma-generating power supply circuit. The power supply and distribution circuit contains significant series inductance, limiting the rate at which current can change in the circuit. A rapid drop in chamber impedance therefore causes a rapid decrease in the magnitude of chamber voltage due to this inductive component. This collapse in chamber voltage magnitude is often sufficient to extinguish the arcing condition and re-establish a glow discharge before serious damage to the chamber, the power supply, or the target can result. Typically, arcing events occur (and disappear) more quickly than the electronics regulating the power supply are able to react, so even if corrective action is initiated by the electronics, some damage to the wafer is possible. As discussed previously, the probability that an item being coated will suffer some form of defect, such as a non-uniform coating on a wafer, increases as a result of each arcing event. Because the chamber voltage drops rapidly when an arcing event occurs, an unexpected voltage drop below a pre-defined or adaptive voltage threshold level can be used to define the occurrence of an arcing condition.

The voltage threshold delineating the existence of an arcing event is dependent upon the nominally applied (i.e., non-arcing), perhaps time varying chamber voltage according to one example implementation. The non-arcing chamber voltage applied to produce a glow discharge is dependent on many factors including the condition and composition of the target (which affects circuit impedance). All other circuit impedances remaining constant, a higher chamber voltage is required to produce a glow discharge using a relatively less-conductive target material, conversely a lower chamber voltage is required to produce a glow discharge using a relatively-higher conductive target material. For example in one sputtering chamber implementation, the chamber voltage required to uniformly deposit aluminum is nearly twice the chamber voltage required to deposit copper. The chamber voltage required to uniformly deposit aluminum can also vary from chamber to chamber, being dependent on the balance of circuit impedance including the power supply and other chamber elements. Furthermore, as the target ages and more material is sputtered, the power required to maintain a uniform deposition rate must be modified (e.g., increased). As the required applied voltage changes, it follows that the associated threshold voltage at which an arcing condition is determined should also be changed.

According to a general example embodiment of the present invention, a plasma generation apparatus includes an arc detection arrangement communicatively coupled to a power supply circuit. The power supply circuit has a cathode enclosed in a chamber, and the power supply circuit is adapted to generate a power-related parameter (e.g., a voltage signal). The arc detection arrangement is adapted to assess the severity of arcing in the chamber by comparing the power-related parameters to at least one threshold. Parameters determining arcing severity are process-dependent and include, but are not limited to, arc quantity, arc rate, arc intensity, arc duration, and/or arc energy.

According to one implementation, the arc detection arrangement for a sputtering process monitors a sputtering chamber voltage and detects an arcing condition whenever the chamber voltage magnitude drops below a preset arc voltage threshold value.

According to one aspect, the power-related parameter (e.g., voltage) threshold value is variable over a range of power-related parameter values. Any threshold may be programmable, and may be controlled by a logic arrangement, for example being electronically controlled by a remote logic arrangement. In one example implementation, the voltage threshold value demarking an arc occurrence is computed in response to an estimate of nominal chamber voltage magnitude, the nominal chamber voltage magnitude being the chamber voltage necessary to produce a glow discharge (i.e., generate a plasma) during non-arcing conditions. In one example implementation, any threshold may be hysteretic, or programmed to be hysteretic having a "reset" value different from a "surpass" value.

According to one aspect of the present invention, the arc detection arrangement is further adapted to count arcing conditions (events) responsive to the at least one threshold. A rate of detected arcing condition occurrences may be determined therefrom.

According to another aspect, the arc detection arrangement is further adapted to measure arcing duration responsive to comparing the power-related parameter to the at least one threshold. For example, the arc detection arrangement includes a clock and a digital counting arrangement in one implementation. The clock provides a clock signal having a fixed period, and the digital counting arrangement is adapted to count the clock signal periods responsive to comparing the power-related parameter to at least one threshold. According to a further aspect of the present invention, the duration of arcing conditions is assessed by comparing the power-related parameter to at least one threshold. According to one example implementation, the duration of arcing conditions is accumulated over a fixed period. According to another example implementation, the duration of arcing conditions is accumulated until the duration threshold is reached, or until the accumulated duration is reset.

According to another aspect, the arc detection arrangement is further adapted to measure arcing intensity responsive to comparing the power-related parameter to the at least one threshold. In one example implementation, the arc detection arrangement is adapted to compare the power-related parameter to a plurality of thresholds arranged at different values thereby ascertaining the extent or range of change (from nominal) to the power-related parameter during an arcing event. In one example embodiment, the threshold corresponding to the largest observed voltage magnitude drop provides a lower bound to the energy estimate, while the next larger voltage drop threshold (which the system is observed to not exceed) provides an upper bound to the energy estimate.

According to another example embodiment of the present invention, the arc detection arrangement is adapted to measure arcing duration and intensity responsive to comparing the power-related parameter to the at least one threshold. In one implementation, the arc detection arrangement is further adapted to measure arcing energy responsive to comparing the power-related parameter to the at least one threshold, arcing energy being proportional to the product of the arcing duration and the arcing intensity, and assessment of arcing severity being a function of the arcing energy (i.e., the product of arcing intensity and arcing duration). According to one particular implementation, a plurality of thresholds are used to determine a plurality of durations, in order to estimate (i.e., approximate, or integrate) an area bounded by a power-related parameter (e.g., chamber voltage) versus time plot during a depression in the voltage due to arcing. An arcing energy proportional to the bounded area for each arcing event is used to assess the severity of arcing. According to a further implementation, the arc detection arrangement is further adapted to accumulate arcing energy over a plurality of arcing events, for example by summing the products of arcing intensity and arcing duration to assess the severity of arcing.

According to another example implementation, the arc detection arrangement includes a power-related parameter band-limiting filter as a means to prevent aliasing prior to digitizing the power-related parameter. Commonly understood digital signal processing techniques are applied to this digitized power-related parameter to reduce or accentuate certain frequency response characteristics of the power-related parameter. This digitally signal processed parameter may then be compared directly against a similarly digitized version of the at least one threshold.

According to another example implementation, a digitally signal processed parameter per above is used to compute at least one time varying threshold value, responsive to certain observed characteristics of one or more power-related parameter over the course of the PVD process.

According to another example embodiment of the present invention, a plurality of power-related parameters are compared to a plurality of thresholds in assessing the severity of arcing as described above. For example, in addition to chamber voltage, power supply current is monitored and used in detecting arcing events, an arcing event being determined whenever the current magnitude exceeds a preset current threshold value.

According to another example embodiment of the present invention, a logic arrangement is communicatively coupled to the arc detection arrangement, and adapted to process the arcing data collected by the arc detection arrangement. In one implementation, the logic arrangement is adapted to interface with the arc detection arrangement, the logic arrangement having a data network and additional external devices such as process controllers, monitors and logic arrangements. In one particular application, the logic arrangement is a programmable logic controller (PLC).

According to another example embodiment of the present invention, arc severity in a plasma generation chamber is assessed by timing an arc duration, which is derived by comparing a power-related parameter to at least one arc intensity threshold, and adding the arc duration to an accumulated arcing duration. Further example implementations of the method include measuring the power-related parameter during non-arcing plasma generation and automatically adjusting the arc intensity threshold(s) responsive to measuring the power-related parameter; counting arc occurrences; and/or assessing arc severity as a function of arc intensity, arc duration and/or the product thereof.

According to another embodiment of the present invention, arcing severity in a plasma generation chamber is assessed by determining an arc intensity, which is derived by: comparing a power-related parameter to at least one arc intensity threshold, timing an arc duration responsive to comparing a power-related parameter to at least one arc intensity threshold, computing arc energy as a function of arc intensity and arc duration, and then adding the arc energy to an accumulated arcing energy. Further example implementations of the method include measuring the power-related parameter during non-arcing plasma generation and automatically adjusting the at least one arc intensity threshold responsive to measuring the power-related parameter; counting arc occurrences responsive to comparing the power-related parameter to the at least one arc intensity threshold; and/or employing a hysteretic arc intensity threshold; and/or transmitting information representative of arcing to a logic arrangement on command via a shared data path, the information being one selected from a group that includes quantity of arc occurrences and accumulated arcing duration. The power-related parameter is a function of plasma generation chamber voltage in one particular implementation; the power-related parameter being formed as a digital representation of plasma generation chamber's operating characteristics in another implementation.

In describing the following particular example embodiments of the present invention, reference will be made herein to FIGS. 1-27 of the drawings in which like numerals refer to like features of the invention.

FIG. 1 illustrates an example embodiment of an arc detection arrangement 100 of the present invention. Arc detection arrangement 100 is used, for example, in a pressure vapor deposition (PVD) process step in integrated circuit manufacture and other processes where uniform material deposition is desired. A PVD sputtering system includes a deposition (vacuum) chamber 10 containing a gas 15, such as argon, at low pressure. A target 20 formed of metal is placed in vacuum chamber 10 and electrically coupled as a cathode to a power supply 30 via an independent power supply interface module (PSIM) 40. According to one example implementation, power supply 30 and chamber 10 are coupled using a coaxial interconnecting cable 35. A substrate (wafer) 25 is coupled as an anode to power supply 30 through a ground connection. The vacuum chamber is also typically coupled to ground potential. According to another example implementation, the anode is coupled to power supply 30 directly. Rotating magnet 27 is included to steer the plasma to maintain uniform target wear. PSIM 40 includes a buffered voltage attenuator 44 adapted to sense the chamber voltage and provide an analog signal to an Arc Detection Unit (ADU) 50 via voltage signal path 42 responsive to the chamber voltage. The PSIM also includes a Hall effect-based current sensor 46 adapted to sense the current flowing to the chamber and provide an analog signal via current signal path 48 to the ADU responsive to the chamber current. In another example implementation, the target is formed of an insulating material. ADU 50 is communicatively coupled to a logic arrangement 60, for example a programmable logic controller (PLC) or communication tophat via a local data interface 70. Logic arrangement 60 may be coupled to a data network 80, for example a high level process control network such as an EG Modbus-Plus TCP-IP on Ethernet.

An electric field is generated between the target (cathode) and anode by the power supply causing the gas in the vacuum chamber to ionize. Ionized gas atoms (i.e., plasma) are accelerated across the potential of the electric field and impact the target at high speed, causing molecules of the target material to be physically separated from the target, or "sputtered." The ejected molecules travel virtually unimpeded through the low pressure gas and plasma striking the substrate and forming a coating of target material on the substrate. Typical target voltage for sputtering aluminum is a steady state magnitude of approximately 450 volts dc (VDC).

Figure 2:
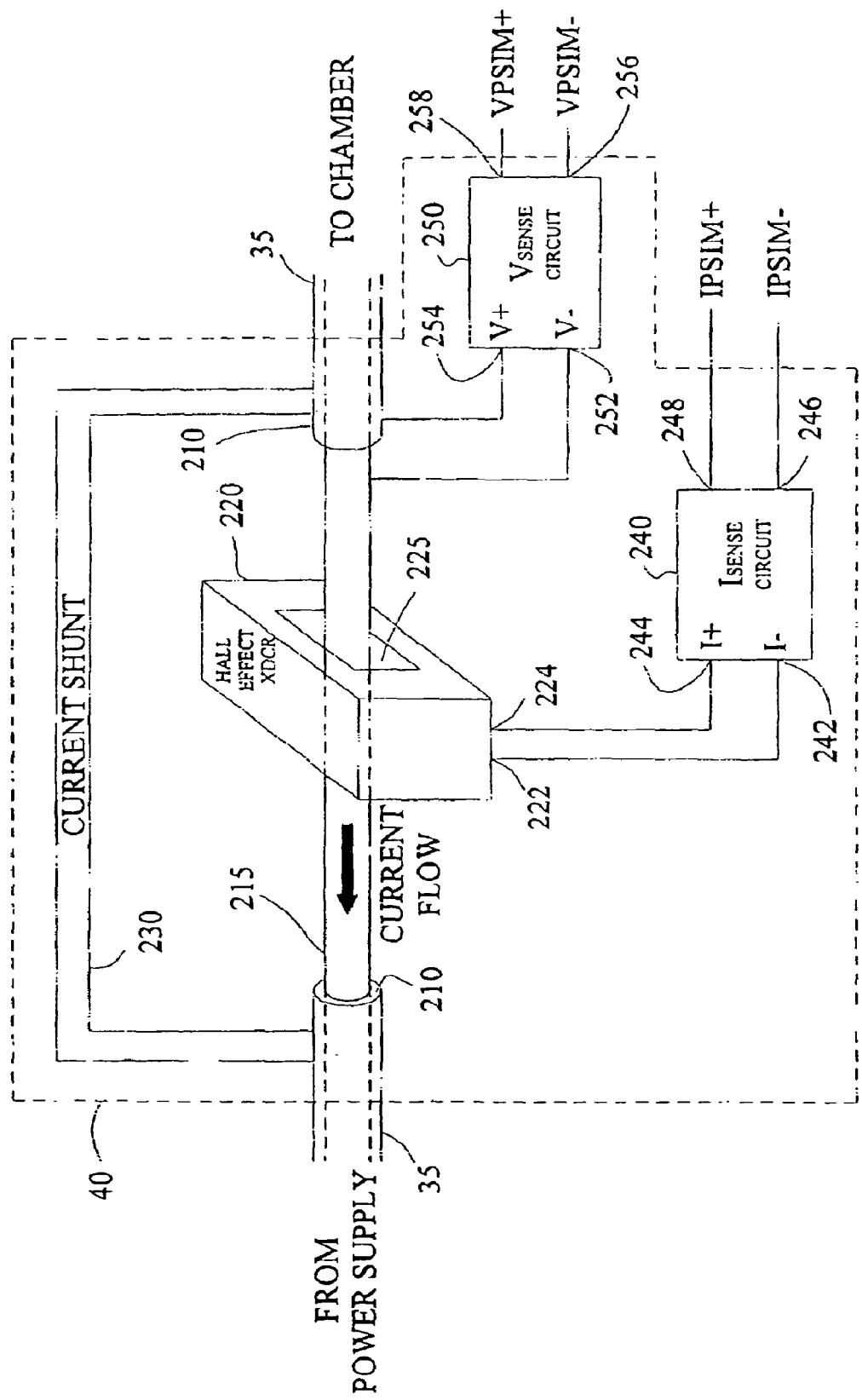
FIG. 2 is a block diagram illustrating one example implementation of a power supply interface module (PSIM) portion of an arc detection arrangement, according to the present invention.

FIG. 2 illustrates one example embodiment of PSIM 40. PSIM 40 derives signals representative to the chamber voltage and current. Coaxial cable 35 electrically couples the power supply to the chamber. Cable 35 has an outer conductor 210 nominally at ground (earth) potential, and a center conductor 215 biased negatively with respect to the outer conductor. Current in cable 35 is measured using a Hall effect transducer 220 or other current transducing device. Transducer 220 is arranged to selectively measure current flowing in center conductor 215, indicative of the total current flowing to the chamber. Center conductor 215 of cable 35 passes through an aperture 225 in Hall effect transducer 220. To expose center conductor 215, outer conductor 210 is interrupted near transducer 220, and outer conductor current is directed around aperture 225 via current shunt 230 coupled to outer conductor 210. The arrangement of Hall effect transducer 220 simplifies packaging of the PSIM while simultaneously providing a high level of galvanic isolation between cable 35 and the output signals of transducer 220. The present invention is not limited to using a Hall effect transducer. Other means for deriving a signal responsive to the current flowing from chamber 10 to power supply 30 are contemplated, including but not limited to an arrangement including a current shunt with appropriate voltage isolation, and means based on certain piezo-resistive current transducers.

Transducer 220 has a first output terminal 222 carrying current signal I− and a second output terminal 224 carrying current signal I+. First and second transducer output terminals are electrically coupled to an Isense circuit arrangement 240, first transducer output terminal 222 being coupled to Isense circuit first input terminal 242, and second transducer output terminal 224 being coupled to Isense circuit second input terminal 244. Isense circuit arrangement 240 also has a first output terminal 246 carrying signal IPSIM−, and a second output terminal 248 carrying signal IPSIM+. Isense circuit receives current signals I+ and I−, and generates a differential voltage between signals IPSIM+ and IPSIM− responsive to the current flowing from the chamber to the power supply.

Vsense circuit 250 measures the potential difference between center conductor 215 and outer conductor 210, and generates a differential responsive to the potential difference. The Vsense circuit includes a first input terminal 252 coupled to inner conductor 215 and carrying voltage signal V−. The Vsense circuit also includes a second input terminal 254 coupled to outer conductor 210 and carrying voltage signal V+. The Vsense circuit has a first output terminal 256 carrying output voltage signal VPSIM−, and a second output terminal 258 carrying output voltage signal VPSIM+.

Coaxial cable 35, connecting power supply 30 to vacuum chamber 10, is terminated in standard commercial UHF type connectors in one example implementation. According to one aspect of the present invention, the mechanical packaging of PSIM 40 is arranged and configured such that cable 35 can be de-terminated at one end, inserted through aperture 225 of PSIM 40 and re-terminated to complete a circuit between power supply 30 and chamber 10. In an alternate implementation, PSIM 40 includes UHF type connectors so that PSIM 40 can be inserted in the circuit of cable 35 between power supply 30 and chamber 10.

Figure 3:
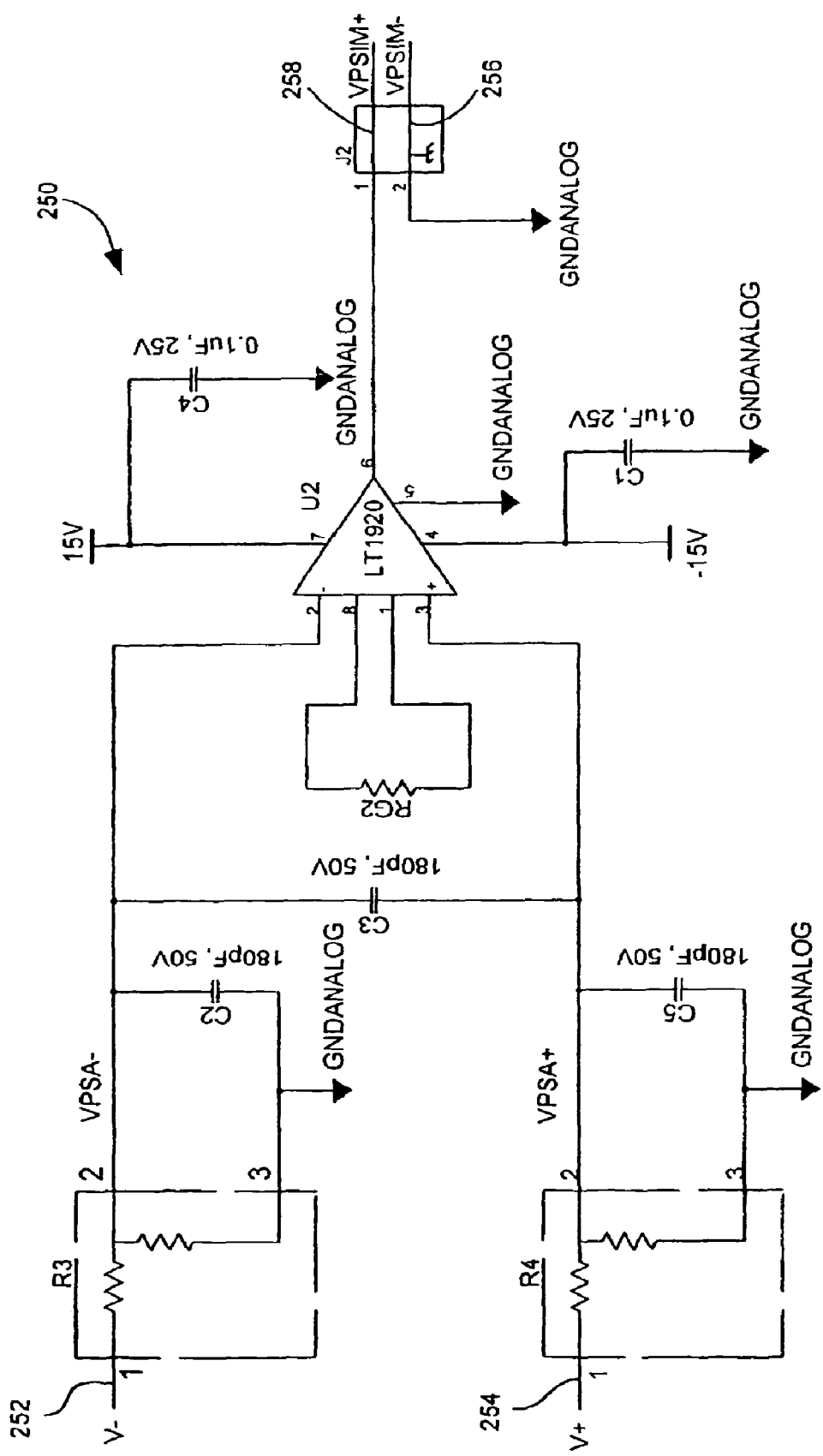
FIG. 3 is a circuit diagram illustrating one example implementation of a PSIM voltage sensing circuit portion of an arc detection arrangement, according to the present invention.

FIG. 3 illustrates one example implementation of Vsense circuit 250 to provide differential output voltage signals responsive to the instantaneous voltage difference between the cathode and anode of the PVD system. The example Vsense circuit illustrated in FIG. 3 provides for a very high impedance between the voltage signals present at its input terminals and the voltage signals provided at its output terminals. The positive input voltage signal 254 (V+) is derived from the outer conductor 210, and the negative voltage signal 252 (V−) is derived from inner conductor 215 of power supply cable 35.

According to the example implementation illustrated, resistor networks R3 and R4 provide an attenuation factor of 500:1 to each respective input voltage signal with respect to a reference plane, GNDANALOG. Each of the resistor networks R3 and R4 have a nominal resistance of approximately 20 Megaohms between the network sense terminal (pin 1) and the reference plane (pin 3). Resistive networks R3 and R4 can be implemented using, for example, thick film high voltage divider networks such as Ohmcraft P/N CN-470. An applied voltage of 1000 volts between 252 (V+) and 254 (V−) causes a current of 25 microamperes to flow into pin 1 of R4 and out of pin 1 of R3. Pin 3 of each of these voltage attenuators (i.e., resistive network) is coupled to the reference plane, GNDANALOG. Since each of the voltage attenuators provide a 500:1 attenuation, a differential voltage measured between pins 2 of each resistive network (i.e., between attenuated signal VPSA+ at pin 2 of R4 and attenuated signal VPSA− at pin 2 of R3) are attenuated by 500:1, and this measurement is independent of the voltage difference between either V+ and GNDANALOG, or V− and GNDANALOG.

The PVD sputtering chamber 10 has radio frequency (RF) energy applied in one example implementation, to stabilize the plasma. Capacitors C2, C3 and C5 of Vsense circuit 250 significantly attenuates (i.e., filters) this high frequency "noise". According to one example implementation, the combination of C2 and R3 has an effective pole at about 22 kHz.

As discussed above, the differential voltage appearing between VPSA− and VPSA+ is a band limited representation of the signal appearing between V− and V+, with a nominal DC attenuation factor of 500:1. The equivalent DC Thevenin source impedance between VPSA− and VPSA+ is high (on the order of 80 kOhms) and therefore not suitable for transmission over large distances or into low impedance loads. Therefore, a differential instrumentation operational amplifier U2; for example an LT1920 instrumentation operational amplifier, is incorporated in the Vsense circuit to serve as a low impedance voltage follower. Operational Amplifier U2 provides high impedance inputs (pins 2 and 3), which will not significantly load the outputs of attenuators R3 and R4. Pin 2 of resistive network R3 is coupled to the inverting input (pin 2) of U2 and Pin 2 of resistive network R4 is coupled to the non-inverting input (pin 3) of U2. Resistor RG2 sets the voltage gain of U2 and is selected to yield a gain of 1 V/V in the example embodiment. The resulting output of U2 (pin 6) is a single ended low impedance voltage source relative to GNDANALOG that closely follows the voltage developed between VPSA− and VPSA+.

The output of U2 (pin 6) is coupled to the center terminal of a BNC type connector, J2, and carries the signal VPSIM+ 258. The outer connector of BNC type connector J2 carries signal VPSIM− 256 and is coupled to the reference plane GNDANALOG. The resulting differential voltage between signals VPSIM+ and VPSIM− is band limited with respect to the differential input signals V+ and V−, and has a nominal DC response of 2 mV/V.

Figure 4:
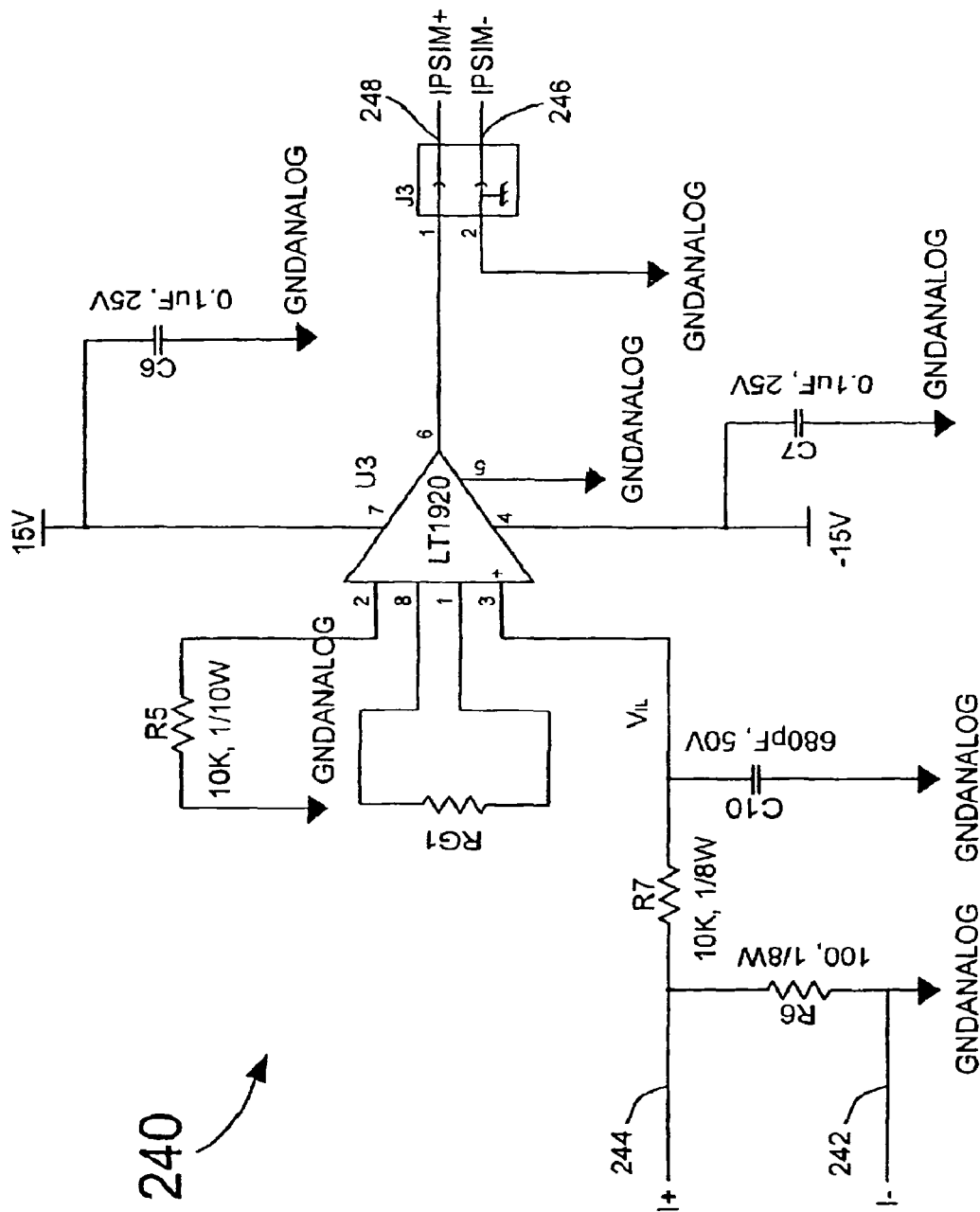
FIG. 4 is a circuit diagram illustrating one example implementation of a PSIM current sensing circuit portion of an arc detection arrangement, according to the present invention.

In one embodiment, the Hall effect type DC current transducer 220 when coupled to an appropriate load impedance placed between signals 244 (I+) and 242 (I−) generates a current responsive to current flowing in inner power supply conductor 215. In one particular embodiment, using a model LA25-P Hall effect type DC current transducer manufactured by LEM, the current signal developed by DC current transducer 220 is approximately proportional to the total current passing through aperture 220 at a ratio of 1000:1. Thus a 1 ampere signal passing through aperture 220 generates a constant current of 1 mA flowing through an impedance placed between 244 (I+) and 242 (I−), within the limits of the DC current transducer design. FIG. 4 illustrates one example implementation of a current sensing arrangement, Isense circuit 240 that generates a voltage responsive to the current developed by the example LA25-P Hall effect type DC current transducer. In this example, signal I− is coupled to the reference plane GNDANALOG of PSIM 40. An impedance comprising 100 Ohm resistor R6 in parallel with a low pass filter comprising resistor R7 and capacitor C10 is coupled between I+ and I−. Ignoring the relative high impedance of the low pass filter, the current I+ flows through resistor R6 and returns to current transducer 220 through I−. The net result of the circuit comprising current transducer 220 and resistor R6 is a voltage across R6 proportional to the current flowing through aperture 222, with the constant of proportionality 100 mV/Ampere. The low pass filter comprising resistor R7 and C10 has a nominal 3 dB cutoff frequency of 23 kHz, which serves to remove any stray noise from the current signal, including the aforementioned RF component sometimes included to stabilize the glow discharge. The low pass filter output, VIL in FIG. 4, is a band limited representation of the voltage developed across R6 by current transducer 220. An instrument amplifier U3, such as an LT1920, serves as a low impedance voltage follower responsive to the signal VIL by coupling VIL to the non-inverting input (pin 3) of U3, with inverting input of U3 (pin 2) coupled to GNDANALOG through resistor R5. Resistor RG1 serves to set the gain of instrumentation amplifier U3 to 1 V/V in the present example. The output terminal (pin 6) of U3 carries signal IPSIM+ and is coupled to the center conductor of a BNC type connector, J3. The outer conductor of BNC type connector J3 is coupled to GNDANALOG and designated signal IPSIM−. The voltage developed between IPSIM+ and IPSIM− is consequently a signal responsive to the current flowing in aperture 220, band limited to a cutoff frequency of approximately 23 kHz and with a constant of proportionality of approximately 100 mV/Ampere.

Figure 5:
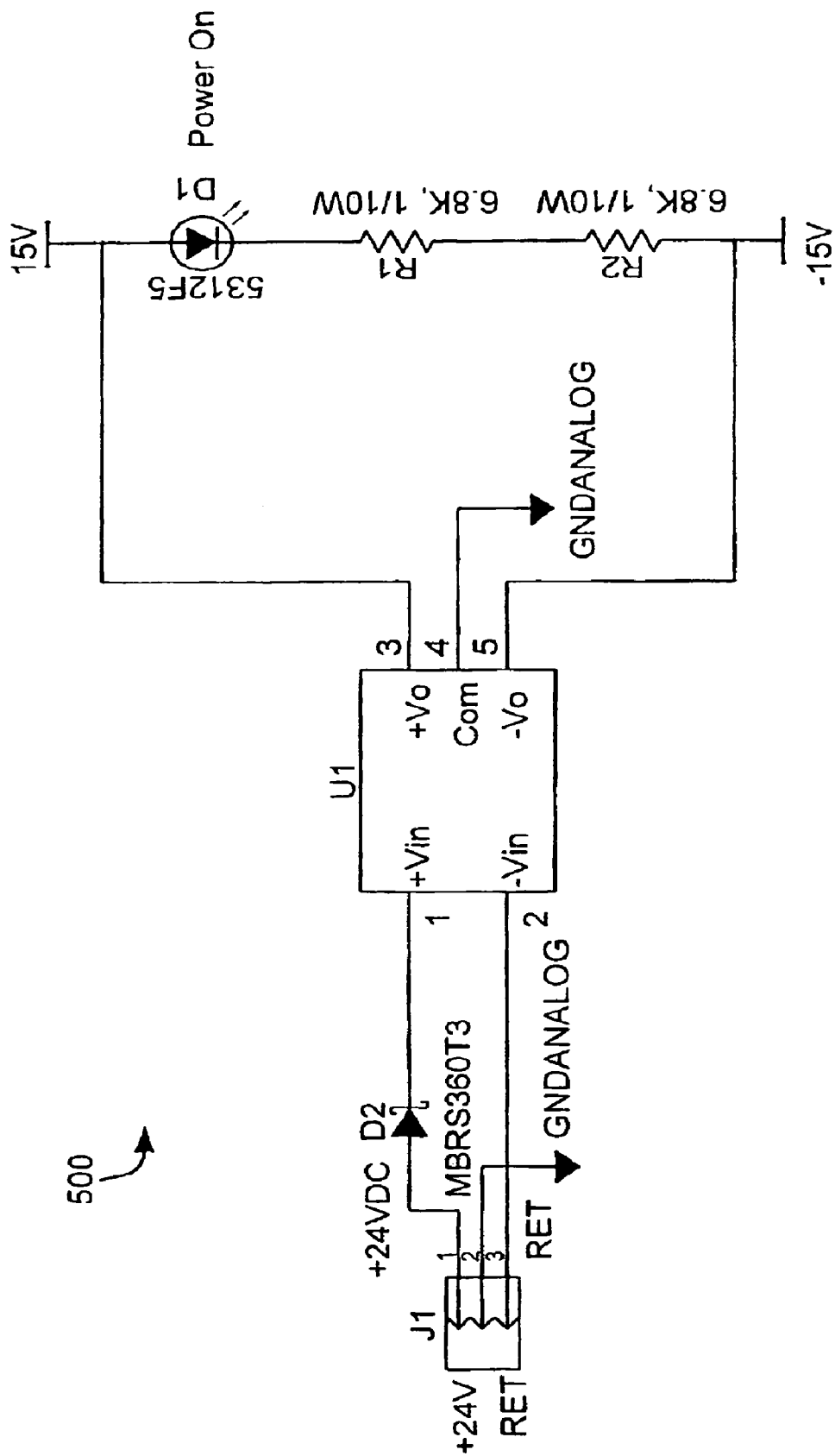
FIG. 5 is a circuit diagram illustrating one example implementation of a PSIM power supply circuit portion of an arc detection arrangement, according to the present invention.

FIG. 5 illustrates one example implementation of a PSIM power supply circuit 500 (not shown in FIG. 2) and required to bias instrumentation operational amplifiers U2 and U3. A dual power supply module U1, for example Astrodyne model FDC10-24D15, generates the nominal +15 VDC and −15 VDC used to bias PSIM amplifiers U2, U3, and current sensor CS1. Module U1 derives its bias power from an external nominal 24 VDC power source through connector J1, pins 1 and 3, pin 1 being biased more positively than pin 3. Pin 3 of connector J1 is coupled to the −Vin terminal of power supply module U1. Pin 3 of connector J1 is coupled to the +Vin terminal of power supply module U1 through a Schottky Barrier Diode D2 to protect module U1 from damage should the polarity of power supplied to connector J1 be accidentally reversed.

Power supply module U1 has three output terminals, +Vo, −Vo and Com. A +15 VDC signal is provided at terminal +Vo and a −15 VDC signal is provided at terminal −Vo. Vo. Terminal Com is coupled to the reference plane GNDANALOG. Pin 2 of connector J1 is also coupled to GNDANALOG as a common potential in the application as required. Resistors R1 and R2 and light-emitting diode D1 are coupled in series between the +15 VDC bias voltage and the −15 VDC bias voltage to provide an indication that PSIM power supply circuit 500 is operational.

Arcing is defined as a collapse in the chamber voltage magnitude that crosses a threshold voltage. Upon occurrence of an arc, the chamber (target) voltage magnitude rapidly decreases (i.e., is closer to ground potential), and chamber current increases more slowly due to series inductance, from steady state (i.e., non-arcing) conditions. The programmed threshold voltage is a predetermined chamber voltage at or below which an arcing state is determined and may be a constant value or a time varying function of the nominal, expected, possibly time varying chamber voltage. A non-arcing state is determined to occur when the chamber voltage is above the threshold voltage. According to an alternate example implementation, the threshold voltage is determined from a period including a non-arcing state, and an arcing state is defined to occur whenever the chamber voltage is below the voltage threshold. Multiple threshold voltages can be used to determine the magnitude of an arc (i.e., voltage dip or "severity"). For example, an arc that crosses a −200V threshold but not a −100V threshold may be considered less severe than an arc that crosses both thresholds.

The ADU 50 includes a digital signal processor to processes the signals received from the PSIM to provide digitally-filtered representations (e.g., digital signals), of the chamber voltage and current signals respectively, to a logic arrangement. According to one example implementation, the ADU includes an analog-to-digital converter (A/D).

The ADU is further adapted to set at least one programmable arc threshold voltage. In a further implementation, the ADU is also adapted to set at least one hysteresis threshold voltage. According to one aspect, the respective thresholds can be set at any point along a continuous spectrum; this can be affected via a potentiometer setting controlling a comparator circuit arrangement. According to another example implementation, the respective thresholds are set digitally via a digital to analog converter, or via a plurality of discrete threshold levels achieved by switching specific circuit components into a comparator circuit arrangement, for example by selecting the configuration of a resistive network. To identify the hysteresis threshold(s), the ADU provides a programmable hysteresis function to detect arcs that manifest themselves slowly. Both the arc (voltage) threshold and hysteresis function can be set or programmed directly in the ADU, or the threshold values may be optionally controlled by a remote device communicatively coupled to the ADU, for example through a standard Momentum communication tophat via a Ethernet, Modbus Plus, Devicenet, or other data network. In one example implementation, the ADU is tightly coupled to a programmable logic controller (PLC) such as a Momentum M1-E via a high speed proprietary serial interface, and the PLC can be programmed to continuously adapt the arc voltage threshold and hysteresis function in real time according to a real time adaptive algorithm.

Figure 6:
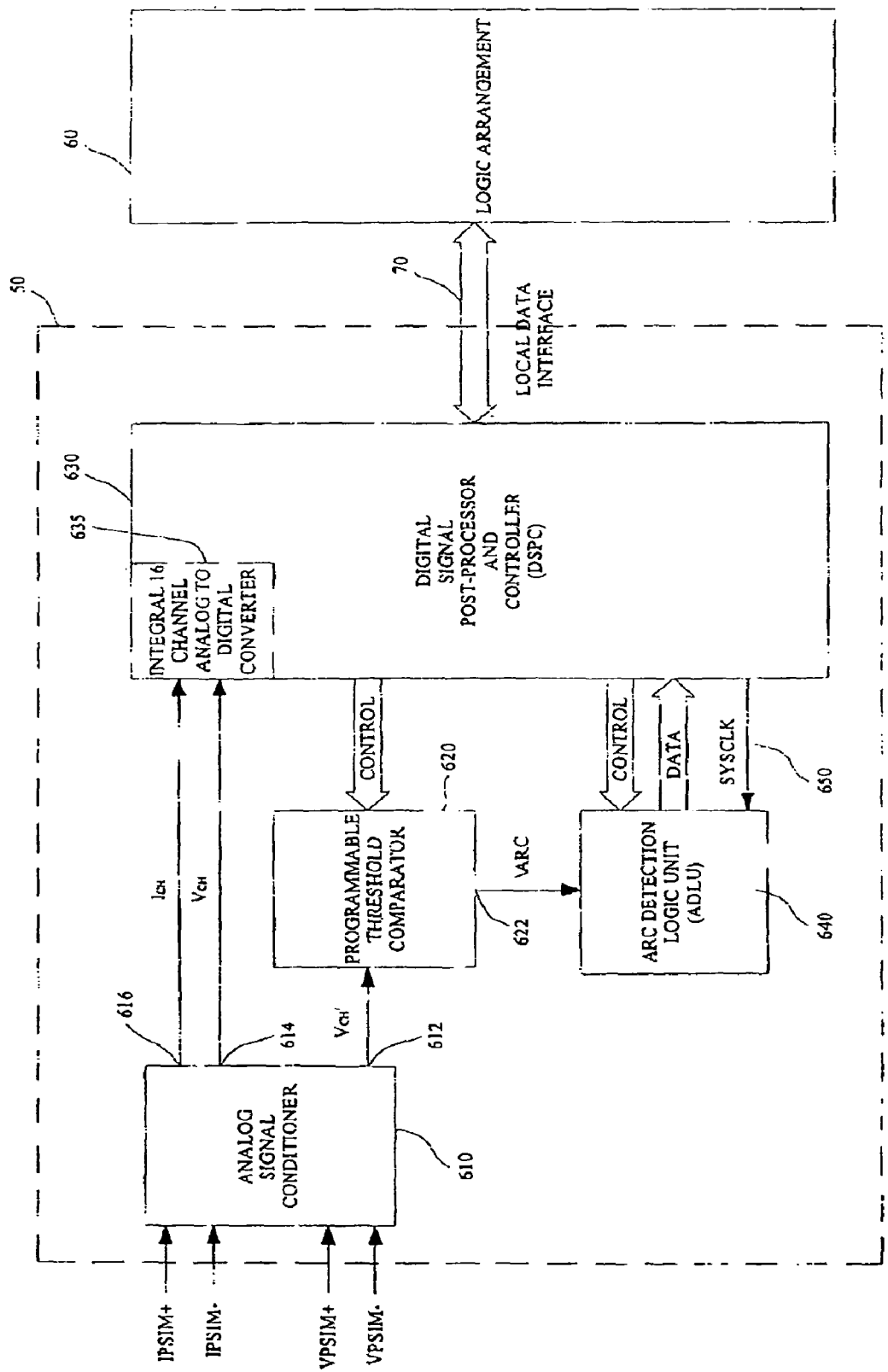
FIG. 6 is a block diagram illustrating one example implementation of an arc detector unit (ADU) portion of an arc detection arrangement, according to the present invention.

FIG. 6 illustrates one example embodiment of an Arc Detector Unit (ADU) based on a Digital Signal Processor and Controller (DSPC) 630, which includes a digital signal processor (DSP) integrated circuit, such as model TMS320F2407 available from Texas Instruments, Inc., of Dallas, Tex., and additional commercially available integrated circuit devices used to develop signals to control and communicate with external devices. An example of such a device is an address decoder commonly used to divide the address space of a DSP into ranges and select one of a plurality of external integrated circuit devices for data transfer to and from the DSP. Development of these signals using integrated circuits is in accordance with the timing requirements of the digital signal processor when accessing external devices and is well understood by those skilled in the art of designing and implementing microprocessor and microcontroller based systems.

The DSP illustrated includes 16 analog input channels that can be sampled and digitized by an integral 10-bit analog to digital converter 635. Signals presented to these analog input channels, such as the signals ICH 616 and VCH 614, to be discussed subsequently, can be sampled and digitized by the DSP at a user programmable rate. In one example implementation, this rate is programmable up to 10 kHz per channel. In another example implementation, a software program executed within the DSP provides for the selection and application of one of a plurality of digital finite impulse response filters to the sampled data signals. DSPC 630 also provides control signals to a Programmable Threshold Comparator function 620 to set the threshold and hysteresis values of the Programmable Threshold Comparator. In addition, DSPC 630 provides control and data paths to and from a high speed Arc Detector Logic Unit (ADLU) 640, which works in conjunction with Programmable Threshold Comparator 620 to accumulate arc statistics such as number of arcs and total arc time. DSPC 630 communicates with an external logic arrangement 60, such as a networked communication tophat or Programmable Logic Controller (PLC), via local data interface 70, for example a proprietary ATII interface. Examples of information that can be furnished from the ADU to the external logic arrangement 60 are the filtered chamber voltage and current, the number of individual arcing events and other values indicative of arc severity, as determined by Arc Detector Logic Unit 640. Examples of data that can be accepted by the ADU from the external logic arrangement are the instantaneous arc threshold voltage and hysteresis, and logical control signals that control the Arc Detector Logic Unit.

The fundamental sensed process inputs of Arc Detector Unit 50 are the differential output signals from the Vsense circuit (VPSIM+ and VPSIM−) and the Isense circuit (IPSIM+ and IPSIM−) of PSIM 40. Referring again to FIG. 6, these signals drive analog signal conditioner 610. Analog signal conditioner 610 converts the respective differential analog signals to single ended signals usable by the rest of the ADU. Signal conditioner 610 also provides band limiting filters for the respective input analog signals so that DSPC 630 can apply digital signal sampling and processing algorithms without the phenomenon commonly called "aliasing". Analog signal conditioner 610 includes three output terminals, output terminal 612 providing signal VCH', output terminal 614 providing signal VCH, and output terminal 616 providing signal ICH. Signal VCH' is a single-ended version of the signal emanating from the PSIM and derived from the signals VPSIM+ and VPSIM−, and feeds a Programmable Threshold Comparator 620. The signal VCH is a band-limited, single-ended version of the differential signals VPSIM+ and VPSIM−, developed by Vsense circuit 250 of PSIM 40. The signal ICH is a band-limited, single-ended version of the differential signals IPSIM+ and IPSIM− developed by Isense circuit 240 PSIM 40. Signals ICH and VCH are input to analog to digital converter 635 of DSPC 630. Processing performed on these analog signals by Digital Signal Processor and Controller 630 will be discussed in more detail subsequently.

Figure 7:
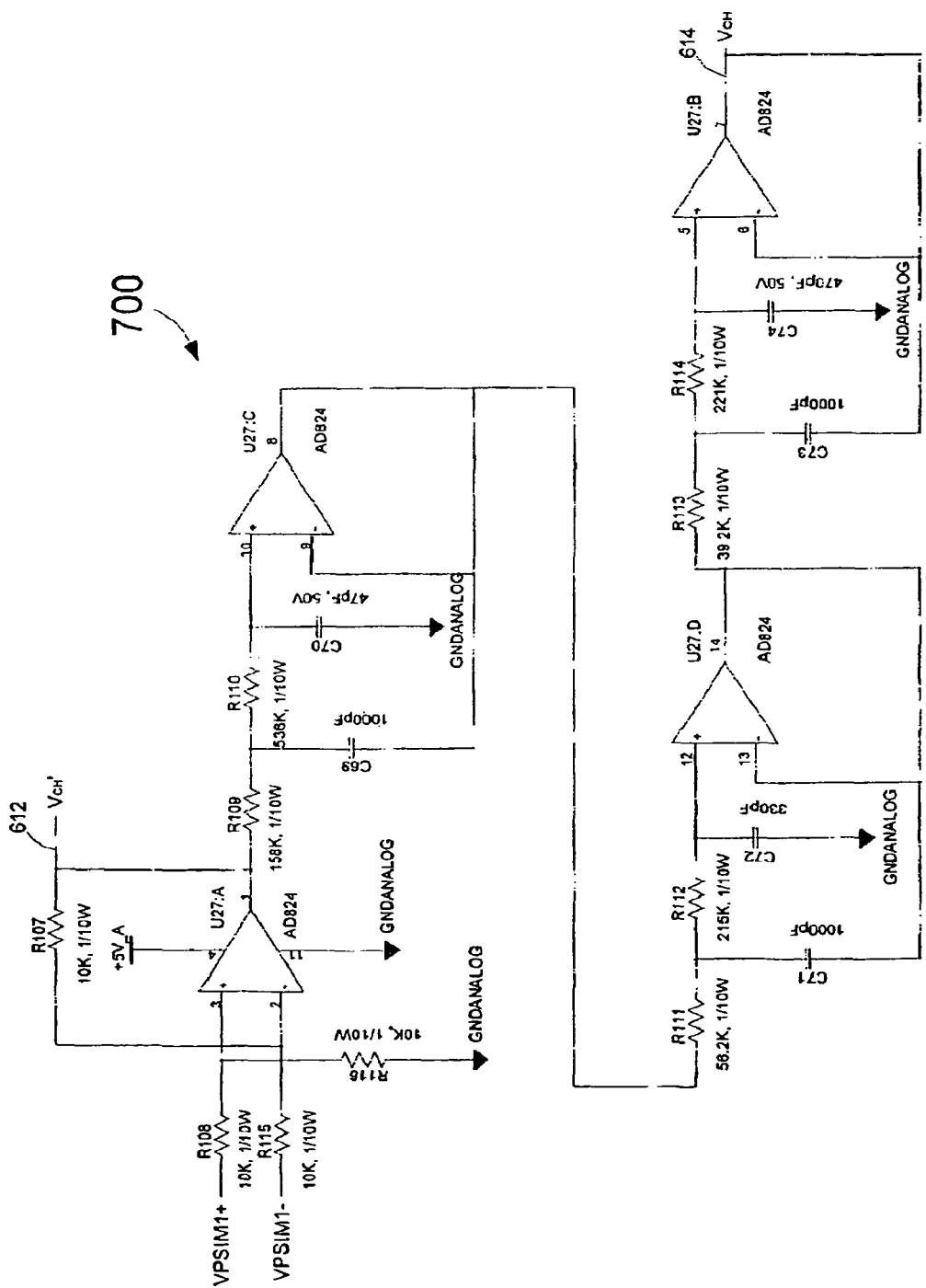
FIG. 7 is a circuit diagram illustrating one example implementation of an ADU voltage filter portion of an arc detection arrangement, according to the present invention.

FIG. 7 illustrates one example implementation of a voltage filter portion 700 of signal conditioner 610 using commercially available quad operational amplifier integrated circuits, such as Analog Devices model AD824 for U27:A-D. Amplifier U27A and resistors R108, R107, R115 and R116 form a differential amplifier that converts the differential voltage between VPSIM1+ and VPSIM1−, to a single ended voltage relative to the reference plane GNDANALOG at the output (pin 1) of amplifier U27A. The output of amplifier U27A is signal 612 in FIG. 6, and labeled VCH'. VCH' couples to the internal network comprising amplifiers U27B, U27C and U27D and the remaining passive resistors, which form a six-pole Butterworth filter with a 3 dB crossover at approximately 2500 Hz. The output of this filter, labeled 614 (VCH) in FIG. 6, is the signal provided to the analog to digital converter 635 of DSPC 630. Assuming a 10 kHz sample rate of analog to digital converter 635, the 6 pole Butterworth filter, shown in FIG. 7, attenuates signals above the Nyquist rate of 5 kHz at better than −80 dB, thus minimizing the effects of aliased signals on the sampled voltage signals.

The current filter portion of signal conditioner 610 that generates signal ICH from PSIM signals IPSIM+ and IPSIM− is identical in topology to that of the voltage filter, but the current signal equivalent to VCH' is not used in the example embodiment. The output of the current filter, ICH is similarly band limited by an identical Butterworth filter with 3 dB crossover at approximately 2500 Hz.

Referring again to FIG. 6, functionally Programmable Threshold Comparator 620 compares signal VCH', responsive to the magnitude of the difference between the chamber voltage signals from the PSIM, against a programmable voltage value set and controlled by DSPC 630. The output 622 of Programmable Threshold Comparator 620 is the signal .backslash.ARC. Programmable Threshold Comparator 622 asserts .backslash.ARC a logic "1" value whenever the sensed differential chamber voltage magnitude exceeds the programmed threshold value and a logic "0" value whenever the sensed differential chamber voltage magnitude is less than the programmed threshold value. A programmable hysteresis is applied to the programmed threshold value in a manner to be described subsequently, to minimize the effects of a noisy VCH' signal applied to Programmable Threshold Comparator 620. Hereinafter, the condition in which the signal .backslash.ARC (i.e., "not ARC") is in the logic "0" state (chamber voltage below a predefined threshold) is referred to as the ARCING condition and the condition in which the .backslash.ARC signal is in the "1" state (chamber voltage above a predefined threshold) is referred to as the NON_ARCING condition.

Figure 8:
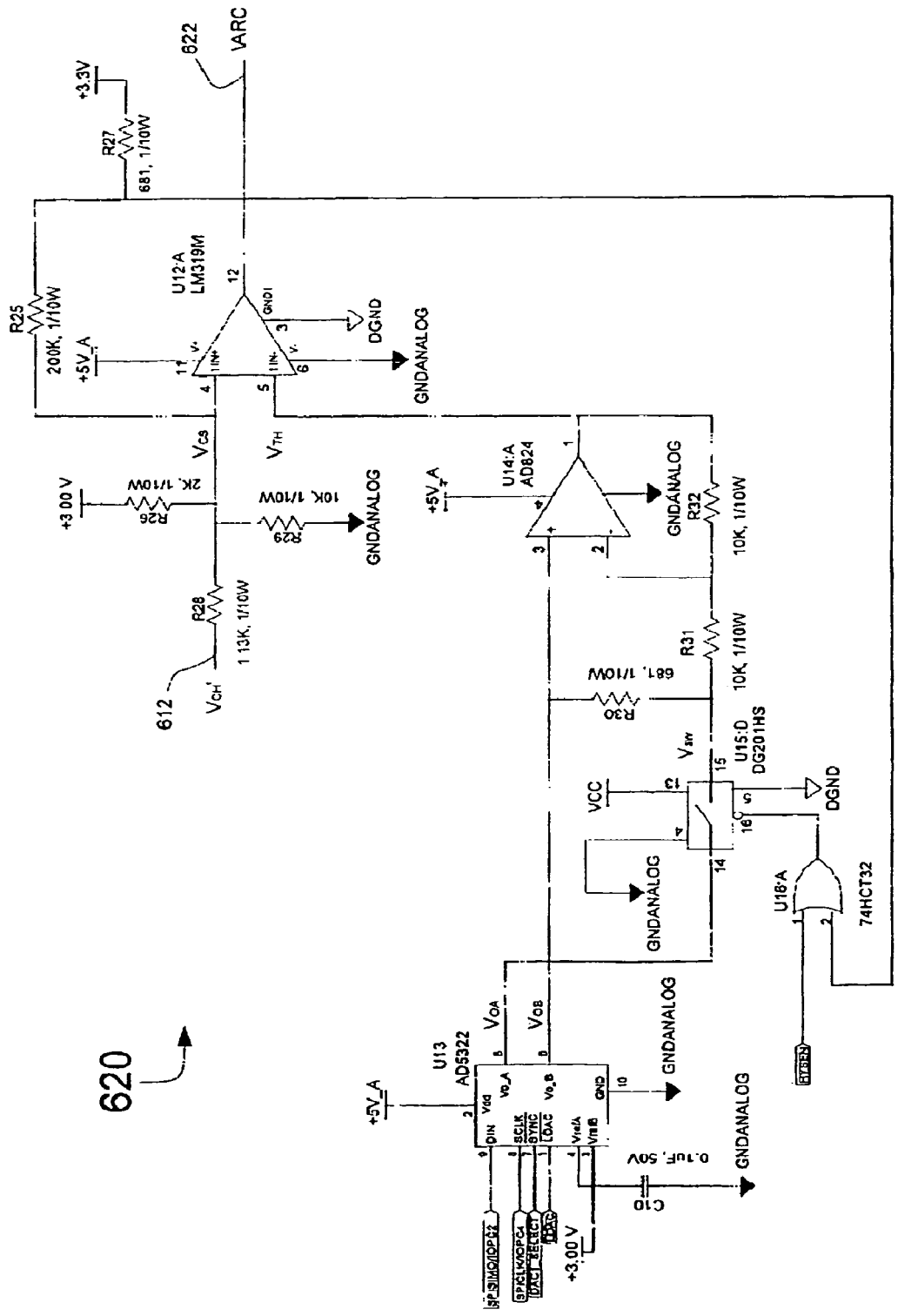
FIG. 8 is a circuit diagram illustrating one example implementation of an ADU programmable threshold comparator portion of an arc detection arrangement, according to the present invention.

FIG. 8 illustrates one example implementation of a Programmable Threshold Comparator 620. Programmable Threshold Comparator 620 includes a commercially available analog comparator integrated circuit U12:A, such as an LM319M. GNDANALOG is the analog reference plane; DGND is a digital reference plane used by the logic signals of DSPC 630 and other devices and integrated circuit bias voltage is at +5 V. Functionally, analog comparator U12:A has an output terminal (pin 12), an inverting input terminal 1IN− (pin 5), and a non-inverting input terminal 1IN+ (pin 4). The output terminal (pin 12) of U12:A generates signal 622 in FIG. 6 and labeled .backslash.ARC. Nominally, the logic signal present at the output terminal is denoted as logic "1" whenever the signal at the non-inverting input is at a higher voltage than the signal at the inverting input terminal. Conversely, the logic signal present at the output terminal is a logic "0" whenever the signal at the non-inverting input is at a lower voltage than the signal at the inverting input terminal. The signal present at the output terminal whenever the two respective signals at the input terminals are identical is undefined. In an embodiment of the present application, device U12:A is arranged to have an open collector output. Resistor R27 is a pull-up resistor, coupled to a +3.3 V bias supply used to power the DSP, ADLU and other circuitry. Resistor R25 is nominally 200 k-ohms and provides a minimum level of hysteresis to analog comparator U12:A to effect smooth logic state transitions without oscillation when U12:A encounters slowly varying input signals. Resistors R28, R29 and R26 along with a precision 3.00 volt reference voltage source connected to R26 provide an affine transformation of the scaled, instantaneous chamber voltage signal VCH', of the form:

$$V_{CS} = 0.6 V_{CH'} + 1.0 \quad \text{(Eqn. 1)}$$

where VCS is that signal appearing on the non-inverting input, pin 4 of analog comparator U12:A in FIG. 8. Thus, according to Eqn. 1, a 0 V signal at VCH appears as a 1 V signal at pin 4 of analog comparator U12:A, and a 2.5 V signal at VCH' appears as a 2.5 V signal at pin 4 of analog comparator U12:A. This affine transformation is applied to maintain the inputs of analog comparator U12:A within a range required by the analog comparator manufacturer to guarantee linear operation over a range of chamber operating voltages between 0 and −1250 volts. In one particular embodiment, the 3.00 volt reference for the internal analog to digital converter is provided by a commercially available bandgap regulator, Model REF 193, manufactured by National Semiconductor.

Programmable threshold voltage signal, VTH, is provided to the inverting input of analog comparator U12:A (pin 5) to set the chamber voltage at which the ADU transitions between the NON_ARCING and ARCING states. A programmable hysteresis value, generated in a manner to be described subsequently, permits the value of VTH to be modal. A user specified value can be programmed to set the chamber voltage magnitude, VTHNA, at which the system transitions from the NON_ARCING to the ARCING state and a second voltage magnitude value, VTHAN, to set the voltage at which the system transitions from the ARCING to the NON_ARCING state. Device U13 is a dual 14-bit digital to analog converter (DAC), for example model AD5322 manufactured by Analog Devices, Inc., which is used to set the two values of VTH. It has two output terminals labeled, VOA and VOB, the voltage values of which are set by the DSP using a standard serial peripheral interface (SPI) feature, integral to the DSP. The signals labeled SPISIMO, SPICLK, .backslash.DAC1_SELECT and .backslash.LDAC are signals used by DSPC 630 to program a digital value ranging between 0 and 4095 for each of the two DAC channels. The precision 3.00 Volt reference described above is applied to U13, with the result that each DAC output generates an independent, analog output in the range 0-3.00 volt, in proportion to the ratio of the programmed digital value to the maximum value 4095. Output terminal VOB (pin 6), generated from the value of DAC B of U13 is coupled to the non-inverting input of operational amplifier U14:A, and is labeled VOB. As will be shown subsequently, the signal VOB determines the voltage threshold at which comparator U12:A transitions from the NON_ARCING to the ARCING state, VTHNA. The signal VOA, generated by the output of DAC A of U13 (pin 5) is coupled to the input terminal of analog switch U15:D, and as will also be shown subsequently, is used along with signal VOB to set the voltage threshold, VTHAN at which comparator U12:A transitions from the ARCING to NON_ARCING state. According to one example implementation, U15:D is part of a quad analog switch, for example DG201HS manufactured by Intersil and others. The output of this analog switch appears at pin 15 of U15:D and is labeled VSW in FIG. 8.

The state transition threshold voltage VTH, is generated at output pin 1 of operational amplifier U14:A. Assuming an ideal operational amplifier U14:A, it is readily shown that the output signal VTH is related to signal VOB and the signal VSW by:

$$V_{TH} = 2V_{OB} - V_{SW} \quad \text{(Eqn. 2)}$$

The instantaneous value of the signal VSW is dependent upon the logic state of the switch control input (pin 16) of U15:D. When the signal at switch control input (pin 16) of analog switch U15:D is in a logic "0" state, VSW follows signal VOA, generated by DAC U13 and connected to input terminal pin 14 of U15:D. When the control signal at switch control input (pin 16) of analog switch U15:D is in a logic "1" state, the circuitry driving output terminal, pin 15, of analog switch U15:D is placed in a very high impedance state and VSW closely follows VOB by virtue of the low resistance value of resistor R30 and the extremely small input bias current of operational amplifier U14.

The signal communicated to the switch control input of U15:D is provided by a logic OR gate U16:A. The input signals to OR gate U16:A are a hysteresis-enabling control output from DSPC 630 (.backslash.HYSEN) and the signal from the output of analog comparator U12:A, (pin 12). The logic state of signal .backslash.HYSEN is generated under DSP software control and is maintained in the logic "0" state under normal operation. The signal .backslash.HYSEN is set to a logic "1" state only during certain manufacturing system calibration and test procedures to isolate the hysteresis generating signal VOA from VSW.

As discussed earlier, the value of VSW and hence VTH is modal by virtue of the state of analog switch U15:D, which is dependent upon the state of digital signal .backslash.ARC at output terminal of analog comparator U12:A (pin 12). The relation between the signals VOA and VOB, both developed by DAC U13 and comparator threshold values VTHNA and VTHAN will now be derived. Assume first that the output signal of analog comparator U12:A is initially in a logic high state. This requires the level shifted chamber voltage signal, VCS on pin 4 of U12:A, to be at a higher level than the present threshold voltage, VTH on pin 5 of U12:A; by definition the NON_ARCING state. In said scenario, the output terminal of analog switch U15:D presents a high impedance and as discussed previously VSW is forced to take the value VOB by virtue of the low resistance value of R30 and the low input bias current of operational amplifier U14:A Under this condition, the signal at the output terminal of op amp U14:A follows VOB, and from Eqn. 2, VTH also takes the value VOB. Thus, voltage signal VOB directly sets the scaled, level shifted voltage at which comparator U12:A transitions from the NON_ARCING to the ARCING state, VTHNA according to:

$$V_{THNA} = V_{OB} \quad \text{(Eqn. 3)}$$

Once the scaled, shifted chamber voltage magnitude, VCS, drops below the programmed NON_ARCING to ARCING state transition value of threshold voltage VTH, VTHNA, generated according to Eqn 3, the signal at the output of comparator U12:A transitions from a logic "1" state (NON ARCING) to a logic "0" (ARCING) state. Assuming the .backslash.HYSEN control signal is in the logic "0" state (enabling the programmable hysteresis function), analog switch U15:D closes and the output of analog switch U15:D, VSW, follows the input of analog switch U15:D, VOA asserted by DAC A of U13, as discussed above. From Eqn. 2 with VOB set to VTHNA, the resulting threshold value VTH becomes:

$$V_{TH} = 2V_{THNA} - V_{OA} \quad \text{(Eqn. 4)}$$

If the programmed value of hysteresis (scaled to reflect the gains of the PSIM and level shifting network) is VHYSS, then setting VOA according to:

$$V_{OA} = V_{THNA} - V_{HYSS} \quad \text{(Eqn. 5)}$$

and substituting into Eqn. 4 provides:

$$V_{THAN} = V_{THNA} + V_{HYSS} \quad \text{(Eqn. 6)}$$

Setting VOA according to Eqn. 5 allows the addition of a fixed hysteresis voltage value VHYSS to the NON_ARCING to ARCING state transition voltage VTHNA when the ADU is in the ARCING state to create the ARCING to NON_ARCING transition voltage value VTHAN. In summary, in this embodiment, DAC B output signal VOB is used to directly set the chamber voltage at which the programmable comparator transitions from the NON_ARCING to ARCING state according to Eqn. 1, while Eqn. 5 indicates an algorithm to determine a value for DAC A to add a hysteresis value to VTHNA to generate a related, but possibly higher transition voltage VTHAN from the ARCING to NON_ARCING state.

According to one implementation, the desired chamber threshold voltage value at which programmable comparator 620 transitions from the NON_ARCING to ARCING state and the desired voltage to be added to this chamber voltage threshold value to define the chamber voltage value at which the programmable comparator transitions from the ARCING to NON_ARCING state can be communicated to DSPC 630 from logic arrangement 60 via local data interface 70 and DSPC 630 can compute the correct digital values to send to DAC U13 to generate the appropriate signals VOA and VOB by virtue of affine transformations using appropriate scaling and offset constants stored integral to the DSP memory. In one example embodiment, to provide highly accurate threshold values, said scaling and offset constant values are computed for an individual module to account for the normal deviations from nominal values encountered in electronic components (e.g., resistor tolerance values) by virtue of a calibration routine. These calibration constant values are stored in a serial EEPROM integral to DSPC 630.

According to one example implementation, the sample rate of the analog to digital converters of DSP 630 is on the order of 10 kHz per channel, or one complete sample of the filtered chamber voltage and current signals, VCH and ICH every 100 uS. At this rate, a randomly occurring microarc of duration of 1 uS or less has a less than 1% probability of being detected by the DSP and, as discussed above, microarcs on the order of 1 uS are both common and can cause damage in integrated circuit manufacture. To reliably detect microarcs on the order of 1 uS or less in duration, ADU 50 includes high speed arc detector logic unit (ADLU) 640 that co-functions with the Programmable Threshold Comparator 620 and which can be controlled and monitored by DSPC 630 to generate statistical data regarding arcing during the PVD process. Referring to FIG. 6, DSPC 630 provides control signals and system clock signal SYSCLK 650 to ADLU 640 and reads and writes data to and from ADLU 640 in a manner to be discussed subsequently. ADLU 640 includes a first high-speed counter adapted to count the number of times the .backslash.ARC signal transitions from a NON_ARCING logic state to an ARCING logic state as determined by the programmed voltage threshold value of Programmable Threshold Comparator 620 and the voltage between anode and cathode of chamber 10. As discussed previously, the duration of an arc is one indication of its severity, along with the magnitude of voltage depression and current increase. Accordingly, ADLU 640 also includes a timer adapted to measure the duration over which the Programmable Threshold Comparator spends in the ARCING state since the last timer reset set in a manner to be discussed subsequently. According to one example implementation, the timer is a counter tabulating clock signal cycles. According to one particular example implementation, the fixed clock operates at 30 MHz. The counter accumulates a (count) value proportional to the total time (since last reset) the chamber has been in an arcing condition during the production cycle. Maintaining a running count of the number of system clock cycles that have occurred during the ARCING state provides one measure as to the total time the sputtering process has spent in an arcing condition.

According to one specific example, the ADLU includes interface means to DSPC 630 in the form of an address and data bus and accepts control signals from DSPC 630 such that DSPC 630 may read and write data from the device. The ADLU includes a register that permits DSPC 30 to control certain ADLU functions, such as resetting, enabling and disabling of counters, and also includes additional registers and control logic to permit DSPC 630 to read status information from the ADLU.

Figure 9:
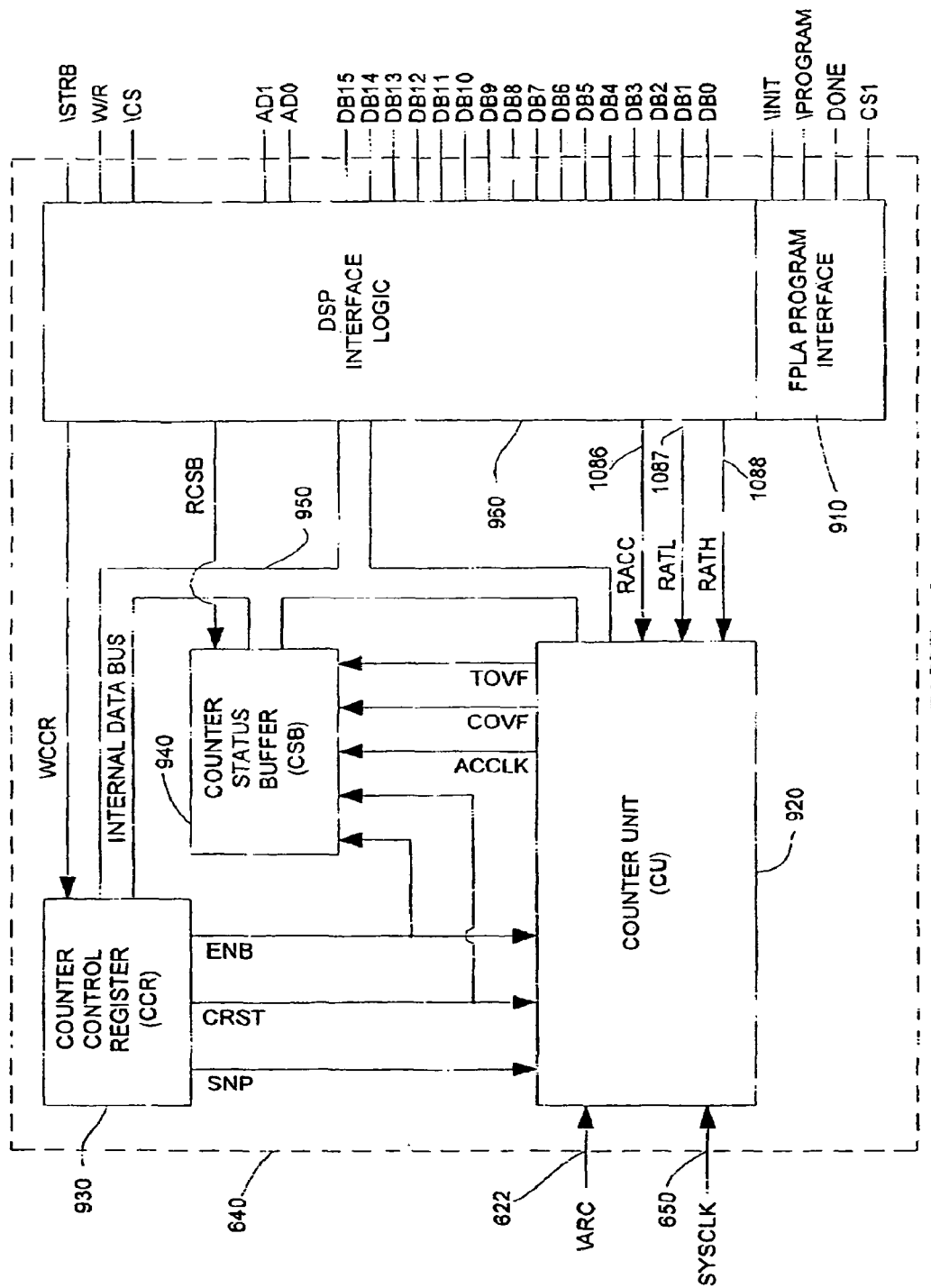
FIG. 9 is a block diagram illustrating one example implementation of an ADU arc detection logic unit (ADLU) portion of an arc detection arrangement, according to the present invention.

FIG. 9 illustrates one example implementation of ADLU 640 of the present invention using a general purpose field programmable logic array (FPLA), programmed utilizing well-known FPLA design tools. Signals shown external to ADLU 640 in FIG. 9 represent signals present on physical pins of the FPLA, the signals being either pre-assigned to particular pins of the FPLA during fabrication of the FPLA, or defined by the FPLA "program" downloaded to the FPLA by the DSP on power-up using an integrated FPLA Program Interface 910 pre-defined at fabrication. ADLU 640 comprises a Counter Unit (CU) 920, a Counter Control Register (CCR) 930, and a Counter Status Buffer (CSB) 940 coupled by an Internal Data Bus structure 950 to a DSP Interface Logic Arrangement 960. Signal .backslash.ARC 622 is a logical input to ADLU generated by Programmable Threshold Comparator 620 as discussed previously. The system clock signal, SYSCLK 650 is a 30 MHz. logic square wave signal provided by DSPC 630 and provides the time base for the ADLU.

Figure 10:
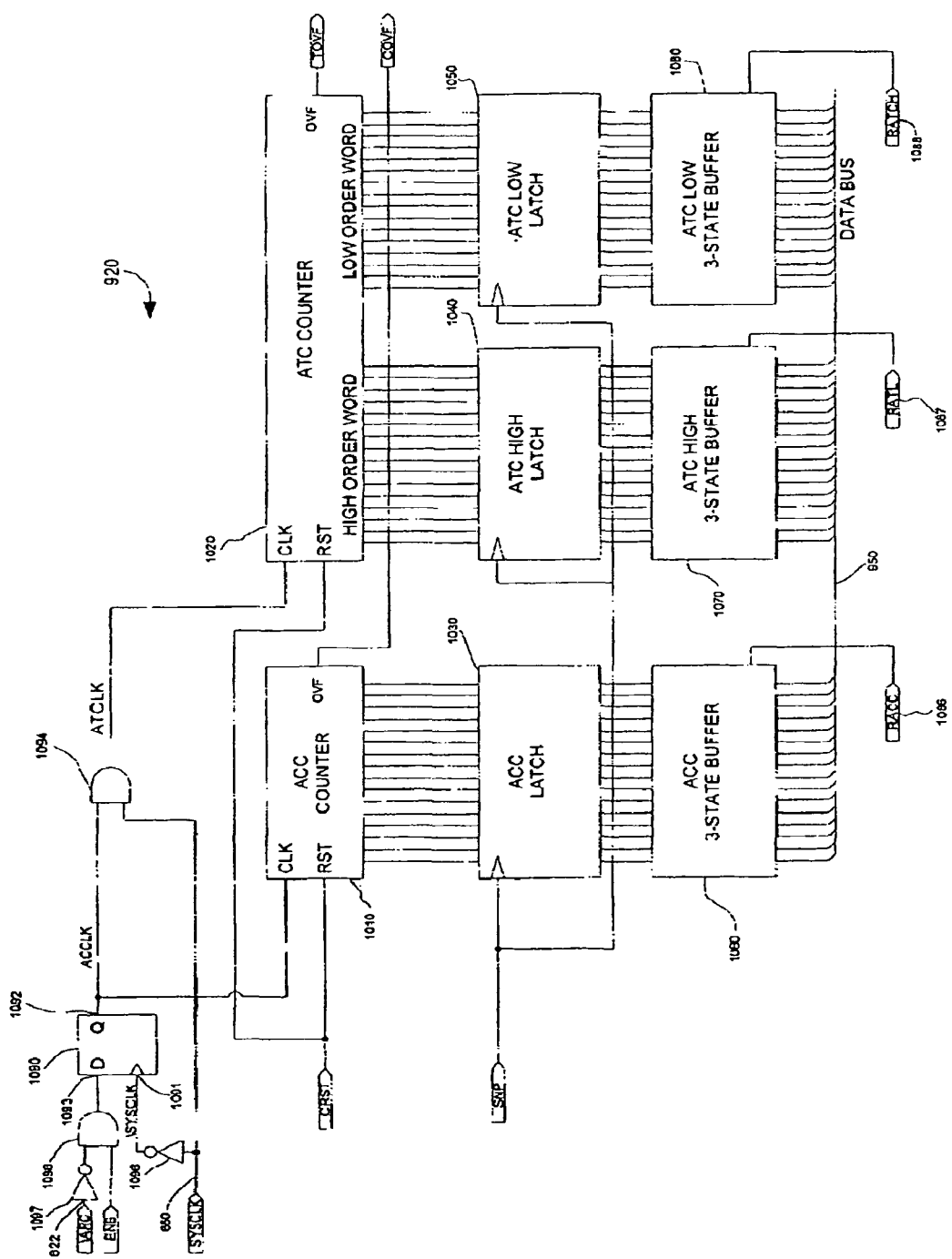
FIG. 10 is a block diagram illustrating one example implementation of an ADLU counter unit portion of an arc detection arrangement, according to the present invention.

FIG. 10 illustrates one example implementation of CU 920 of the present invention. CU 920 comprises a 16-bit asynchronous binary counter (ACC) 1010, a 32-bit asynchronous binary counter (ATC) 1020, three 16-bit latches (ACC Latch 1030, ATC High Latch 1040, and ATC Low Latch 1050), and three 16-bit tri-state buffers (ACC 3-State Buffer 1060, ATC High 3-State Buffer 1070, and ATC Low 3-State Buffer 1080). Three digital signals, counter reset (CRST), enable (ENB) and snapshot (SNP) are provided from Counter Control Register 930 to control the operation of the ACC and the ATC counters respectively. When asserted by CCR 930, the CRST signal causes both the ACC and ATC counters to reset to zero and holds the counters in the reset condition while asserted. When CCR 930 releases the CRST signal, the counters are respectively enabled, and increment on each high-to-low transition of their respective clock (CLK) signal inputs. Each counter has a respective overflow bit (OVF) which is asserted (and latched) should a particular counter "roll over" by counting past its maximum quantity capacity and back to zero. An OVF signal remains high until cleared by assertion of the CRST signal. ACC counter 1010 is driven by signal ACCLK, ACCLK being derived from the output terminal 1092 of D flip-flop 1090. ATC counter 1020 is driven by signal ATCLK, which in turn originates from the output terminal of NAND gate 1094.

Figure 11:
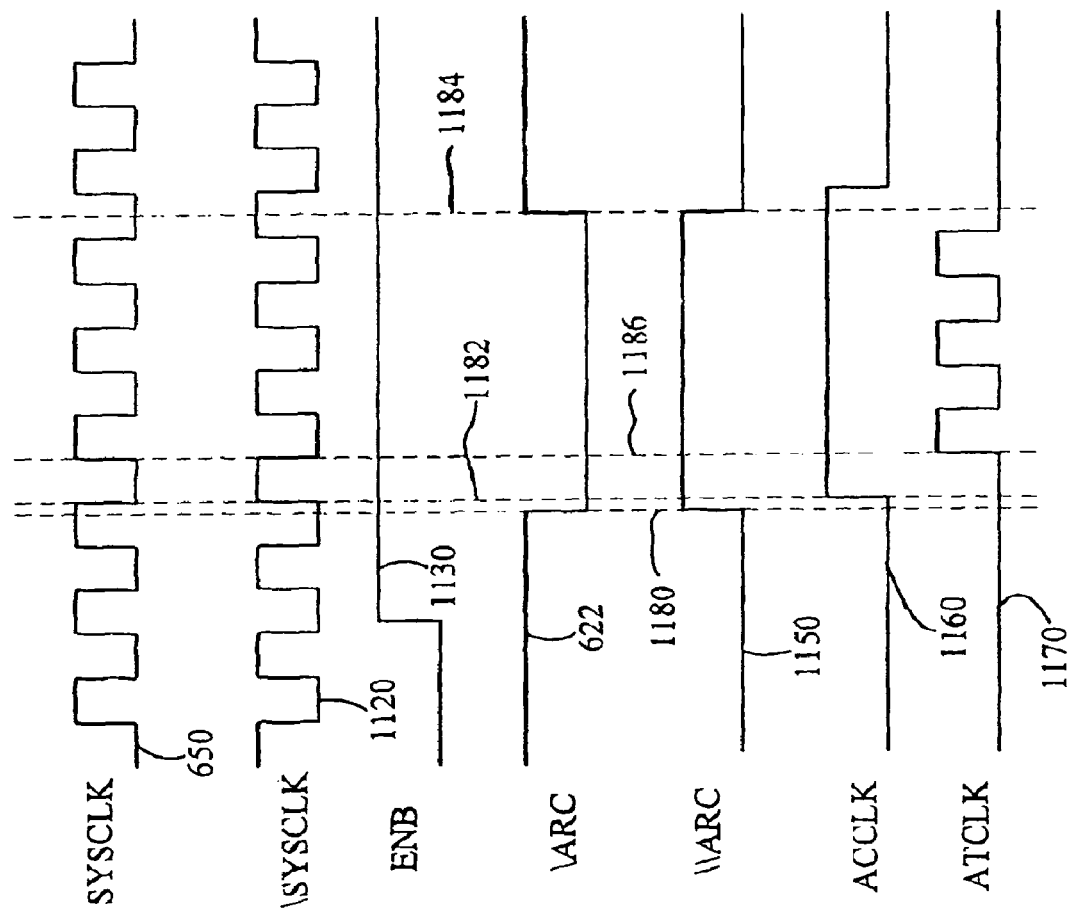
FIG. 11 is a timing diagram illustrating one example implementation of clock logic unit (CLU) clock generation, according to the present invention.

FIG. 11 is a timing diagram illustrating the relationships between various signals of ADLU 640. Referring to FIGS. 10 and 11, the DSPC system clock signal, SYSCLK 650 is negated by inverter 1096 to become .backslash.SYSCLK 1120. Signal .backslash.SYSCLK drives the clock input terminal 1091 of D flip-flop 1090. On each high-to-low transition of the SYSCLK signal from the DSP, the value appearing at the D input terminal 1093 is latched into the D flip-flop and appears at the Q output terminal 1092 of flip-flop 1090 after a short propagation delay.

The signal presented at the D input terminal 1093 of the D flip-flop is driven by AND gate 1098. Input signals to AND 1098 are the signal ENB 1130 provided from the Counter Control Register 930, and the negation of signal .backslash.ARC 622 (.backslash. . . . backslash.ARC 1150) from inverter 1097, signal .backslash.ARC 622 being provided by Programmable Comparator 620. When either the signal ENB 1130 is in the logic low (FALSE) state, or the .backslash.ARC signal is in the high state (indicating detection of a NON_ARCING chamber condition), the signal at the D input terminal 1093 is in the logic low state. Conversely, when the ENB signal is in the logic high state (thereby enabling counting), and the .backslash.ARC signal is in the logic low state (indicating detection of an ARCING chamber condition), the signal at the D input terminal 1093 is in the logic high state. Therefore, assuming counting is enabled (signal ENB 1130 is in a logic high state), the ACCLK signal 1160 will be in the logic low state on subsequent high-to-low transitions of the SYSCLK when the chamber is detected in a NON_ARCING condition. When an ARCING condition is detected, for example as indicated at 1180 in FIG. 11 (and assuming counting is still enabled), the .backslash.ARC signal is asserted low. On the next high-to-low transition of the SYSCLK signal (as indicated at 1182 in FIG. 11), the ACCLK signal will transition from a low to a high logic state, and remain in a high logic state through subsequent cycles of the SYSCLK signal, until the ARCING condition is no longer detected (and the .backslash.ARC signal returns to a logic high state as indicated at 1184 in FIG. 11).

ACC counter 1010 increments at each low-to-high transition of the signal at its CLK input terminal whenever the CRST signal is asserted low. Thereby, ACC counter 1010 effectively counts the quantity of chamber transitions from the NON_ARCING condition to the ARCING condition, while the ENB signal is asserted high (enabling the counting). In the example embodiment, ACC counter 1010 can resolve microarcs detected by the Programmable Comparator 620 (generating the .backslash.ARC signal) as short as 33 nS using a SYSCLK signal having a frequency on the order of 30 MHz. Higher resolution can be achieved by increasing the clock rate.

ATC counter 1020 is used to estimate the total time the chamber is in the ARCING condition as determined by Programmable Comparator 620. ATC counter 1020 increments at each low-to-high transition of the signal at its CLK input terminal whenever the CRST signal is asserted low. The CLK input terminal of ATC counter 1020 is driven by signal ATCLK 1170 provided by AND gate 1094 having ACCLK and SYSCLK signal inputs. Signal ATCLK 1170 begins tracking the SYSCLK signal 1110 whenever counting is enabled (ENB signal 1130 is high) and a chamber ARCING condition is detected (.backslash.ARC signal 1140 is low), for example at 1186 in FIG. 11. Thereafter, ATC counter 1020 counts the clock cycles of the ATCLK signal 1170 that persist while the Programmable Threshold Comparator is in the ARCING state, indicating an arc in the PVD chamber. Using a 30 MHz system clock, the duration of each ARCING condition can be resolved to within a 33 nS increment.

The ACC 1030, ATC High 1040 and ATC Low 1050 latching snapshot registers permit the ACC counter 1010 value, the ATC counter 1020 high order word, and the ATC counter 1020 low order word values to be captured respectively, on command at an instant in time. This permits DSPC 630 to read the state of the counters at a specified instant, holding those values for subsequent retrieval by DSPC 630, while permitting the ACC and ATC counter to continue to operate according to their respective logic described above. Each of these three 16-bit registers is arranged and configured to capture the instantaneous corresponding counter value on a low-to-high transition of the SNP signal, provided by Counter Control Register 930 under control of DSPC 630 as will be discussed. The output signal of each of the snapshot registers are 3-state buffered to an internal data bus 950 by the ACC 1060, ATC High 1070 and ATC Low 1080 3-state buffers respectively. The DSP Interface Logic 960 asserts an enable signal on RACC 1086 to ACC 3-state buffer 1060 in order to provide the captured value of ACC latching snapshot register 1030 on internal bus 950; asserts an enable signal on RATH 1087 to ATC High 3-state buffer 1070 in order to provide the captured value of ATC High latching snapshot register 1040 on internal bus 950; and asserts an enable signal on RATL 1088 to ATC Low 3-state buffer 1080 in order to provide the captured value of ATC Low latching snapshot register 1050 on internal bus 950.

Referring again to FIG. 9, the CCR latching register 930 generates the SNP, CRST and ENB signals. DSP Interface Logic 960 provides proper address decoding and timing signals, asserting the commanded values of the SNP, CRST and ENB signals on Internal Data Bus 950 and generating signal WCCR to latch these values into the CCR when commanded to do so by DSPC 630. Counter Status Buffer (CSB) 940 is a 3-state buffer arranged and configured to assert present values of the CRST, ENB, ACCLK, COVF and TOVF signals onto internal data bus 950 when commanded by DSP Interface Logic 960 through assertion of the signal RCSB. DSP Interface Logic 960 subsequently asserts these signals onto the DSPC data bus for use by DSPC 630.

Referring again to FIG. 9, externally supplied signals in the form of data bus lines DB0-DB15 provide bi directional communication of data to and from DSPC 630, according to the actions of signals .backslash.STRB, W/R and address lines AD0-AD15, asserted by DSP 630 to facilitate communication with external devices such as ADLU 640. These data lines are effectively tied internally directly to internal data bus 950 of ADLU 640. DSP 630 asserts the .backslash.STRB signal low when attempting to communicate with any external peripheral device, such as ADLU 640. DSPC 630 also asserts signal W/R low when attempting to read from a device, and high when attempting to write to a device. These are general purpose signals asserted by DSPC 630 to communicate with any device. The signal .backslash.ADLU_CS is asserted low by DSPC 630 specifically to read or write data from or to ADLU 640. DSP Interface Logic 960 is included in ADLU 640 to generate timing and control signals WCCR, RCSB, RACC, RATL and RATH on command by DSPC 630, according to the operation of the control signals .backslash.STRB, W/R and a decoding of address signals AD0 and AD1. Signal WCCR is used to latch the values of ENB, CRST and SNP asserted by DSPC 630 onto Internal Data Bus 950 into CCR 930. Signal RCSB causes the values in CSB 940 to be asserted onto the Internal Data Bus to be subsequently read by DSPC 630. Signals RACC, RATL and RATH enable ACC 3-State Buffer 1060, ATC High 3-State Buffer 1080 and ATC Low 3-State Buffer 1070 respectively as described above to assert the values in latches ACC LATCH 1030, ATC LOW LATCH 1050 and ATC HIGH LATCH 1040 onto Internal Data Bus 950 to be subsequently read by DSPC 630.

Figure 12:
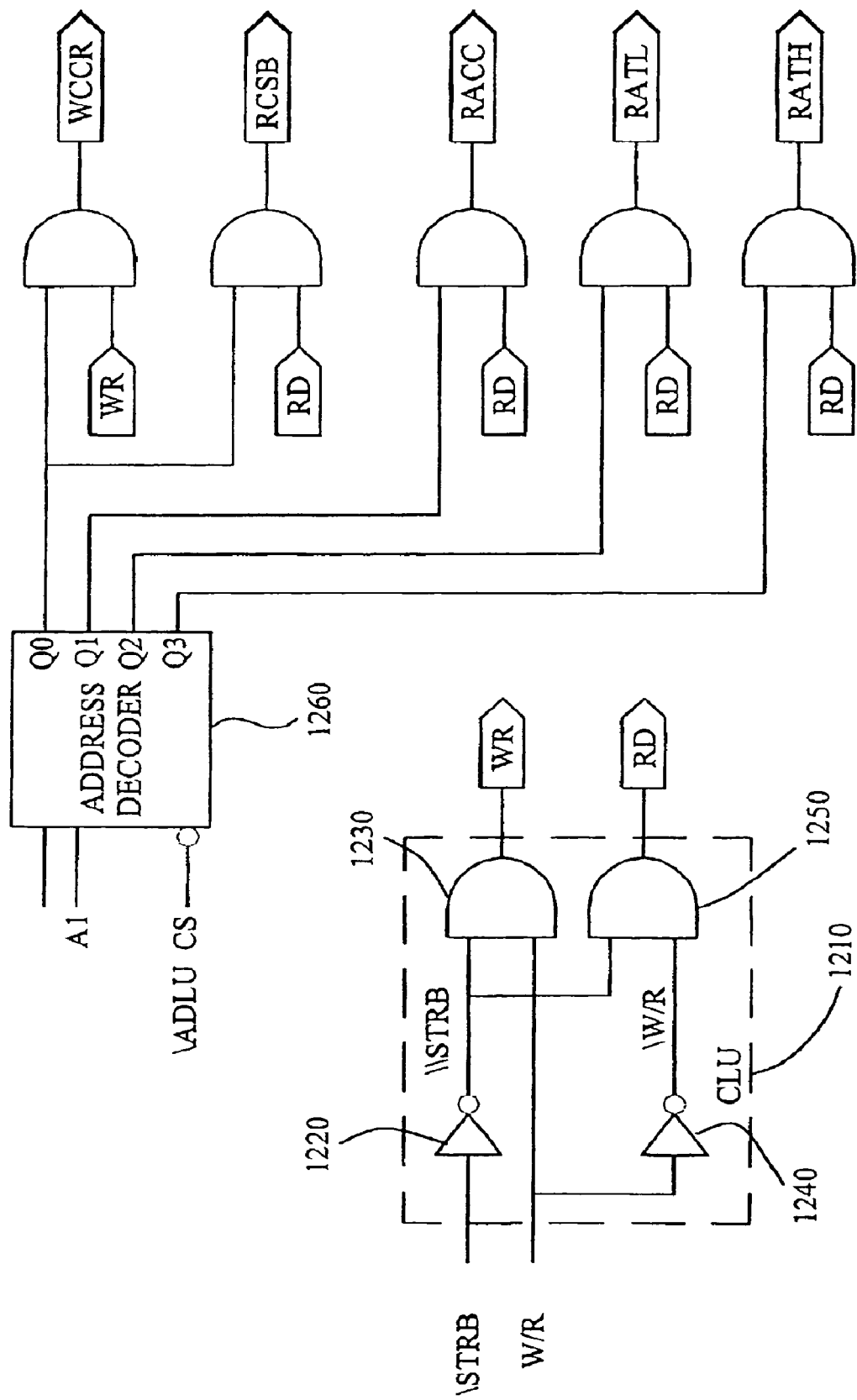
FIG. 12 is a logic diagram illustrating one example implementation of an ADLU digital signal processing interface logic arrangement portion of an arc detection arrangement, according to the present invention.

FIG. 12 illustrates one example implementation of DSP Interface Logic 960 of the ADLU 640 of the present invention, to generate signals WCCR, RCSB, RACC, RATL and RATH shown in FIG. 9. Internal to DSP Interface Logic 960, control logic unit (CLU) 1210 inverts the .backslash.STRB signal, asserted by DSP 630, via inverter 1220 to form the internal signal .backslash. . . backslash.STRB. Signal .backslash. . . backslash.STRB is a logic high when DSPC 630 is attempting to communicate with any external device. The WR signal is provided at the output of AND gate 1230, from input signals .backslash. . . backslash.STRB and the signal W/R, which is asserted high by DSPC 630 when attempting to write to an external device. The W/R signal is inverted via inverter 1240 to form signal .backslash.W/R, with signal .backslash.W/R asserted a logic high when the DSP Interface Logic 960 is attempting to read from any external device. The RD signal provided at the output of AND gate 1250 from input signals .backslash. . . backslash.STRB and .backslash.W/R, is consequently asserted high whenever the DSPC 630 is reading from an external device.

Address decoding to generate the control signals for ADLU 640 is functionally provided by an address decoder, for example, a 2-to-4 binary address decoder 1260 as shown in FIG. 12. As stated above, DSPC 630 asserts logic 0 on the .backslash.ADLU_CS terminal of ADLU 640 when reading from or writing to ADLU 640. When the .backslash.ADLU_CS signal is set to a logic high state, all four signals at output terminals of decoder 1260 Q0, . . . , Q3 are set to a logic low state. When the .backslash.ADLU_CS signal is asserted in a logic state by DSPC 630, decoder 1260 sets exactly one of the signals at the output terminals to a logic high state, the particular output set to logic high determined from the present value of the A0 and A1 bits asserted by DSPC 630 and in accordance with Table 1, where "0" in Table 1 is a logic low, "1" is a logic high, and "X" is an irrelevant state:

TABLE 1

| Input \ADLU_CS | Input A1 | Input A0 | Output Output Asserted High |
|---|---|---|---|
| 1 | X | X | NONE |
| 0 | 0 | 0 | Q0 |
| 0 | 0 | 1 | Q1 |
| 0 | 1 | 0 | Q2 |
| 0 | 1 | 1 | Q3 |

With the decoder logic as set forth above, Table 2 defines the logic generating the signals at each of the function select outputs in FIG. 12, as well as the operation performed by DSPC 630 on the ADLU.

TABLE 2

| SIGNAL NAME | LOGIC | DSPC 630 FUNCTION |
|---|---|---|
| WCCR | Q0 AND WR | WRITE COUNTER CONTROL REGISTER VALUE |
| RCSB | Q0 AND RD | READ COUNTER STATUS BUFFER |
| RACC | Q1 AND RD | READ ACC LATCH VALUE |
| RATL | Q2 AND RD | READ ATC LOW LATCH VALUE |
| RATH | Q3 AND RD | READ ATC HIGH LATCH VALUE |

The processing of signals ICH and VCH generated by Analog Signal Conditioner 610 is now discussed in greater detail. Referring again to FIG. 6, the signals ICH and VCH, generated by Analog Signal Conditioner 610 are responsive to the chamber voltage and current, but are conditioned by Analog Signal Conditioner 610 to minimize aliasing at sampling frequencies greater than about 10 kHz. Integral to the TMS320F2407 DSP incorporated in DSPC 630 is a 16 channel, dual 10 bit analog to digital converter module that converts voltages at its input channels into numbers ranging between 0 and 1023, in proportion to a reference voltage, and an internal timing mechanism under software control that can sample the up to 16 input voltages at a fixed rate. In one particular embodiment, the reference voltage for the internal analog to digital converter is provided by a commercially available bandgap regulator, Model REF193, manufactured by National Semiconductor. This regulator provides a stable, accurate 3.00 volt source to the analog to digital converters. Thus, the integral analog to digital converters provided in the digital signal processor of DSPC 630 convert the time varying signals ICH (t) and VCH (t) to number sequences {NICH} and {NVCH} ranging between 0 and 1023 according to:

$$N_{ICH}(n)=\text{FIX}((I_{CH}(nT)/V_{REF})*1024) \quad \text{(Eqn 8)}$$

and $$N_{VCH}(n)=\text{FIX}((V_{CH}(nT)/V_{REF})*1024) \quad \text{(Eqn 9)}$$

Where the function FIX(arg) truncates the value of its argument "arg" to the nearest integer, n denotes the nth sample taken by DSPC 630 from a reference time and T is the sample period. In one particular embodiment, the DSP is programmed to convert the analog signals VCH and ICH at a rate of 10 kHz, resulting in sampled data sequences of numbers {NVCH} and {NICH} responsive to the chamber voltage and current. In one particular embodiment, software internal to the DSP provides for the application of user selectable digital finite impulse response (FIR) filters to the sequences, resulting in filtered sequences {FVCH} and {FICH} respectively, although other signal processing techniques can be applied to the sequences without loss of generality. In one particular embodiment, an affine transformation is applied to the sequences {FVCH} and {FICH} resulting in sequences of numbers {SFVCH} and {SFICH} that are a scaled integer estimate sequences of the chamber voltage and current. In one example, the affine transformations are such that a continuously applied chamber voltage of 1000 volts results in the generation of a sequence of integers each with value 1000, with other voltage values scaled proportional. Similarly, in this example, the affine transformation applied to the sequence derived by sampling and converting the ICH signal takes into consideration the various gains and offsets of the PSIM and Analog Signal Conditioning circuits, resulting in a transformation in which a current of 10.00 Amperes appears as the integer 1000, with other values proportional.

In one example implementation, the present value of the sequences are communicated via high speed communication interface 70 to logic arrangement 60 where logic arrangement 60 uses the present and past values to compute an adaptive arc threshold voltage value to be used by Programmable Threshold Comparator 620. This adaptive arc threshold voltage value and desired hysteresis level is subsequently communicated from logic arrangement 60 back to DSPC 630 via High Speed Communication Interface 70. DSPC 630 then converts the desired threshold values to the appropriate DAC values according to the operation of Programmable Threshold Comparator 620. This approach results in a near real time adaptive threshold. In another example implementation, the algorithms to generate the adaptive threshold reside in DSPC 630 itself, resulting in an adaptive voltage threshold with minimal delay.

One example algorithm to generate an adaptive arc voltage threshold is to base the computed threshold on a moving average of the voltage sequence computed by DSPC 630, the length of the moving average chosen to be long compared to the expected duration of an arc, but short with respect to the period of rotation of the steering magnet. At a 10 kHz sample rate, the moving average can be computed using a uniformly weighted 64 point FIR filter, the sequence at the filter output representing the average of the previous 6.4 mS of voltage measurements. In one implementation, the adaptive arc threshold value is computed by subtracting a fixed voltage from the moving average. In another example implementation, the adaptive threshold is computed as a fixed percentage of the moving average.

These filtered, transformed sequences can also be used to provide further information indicative of the overall health of the process. In one example, multiplying the instantaneous value of the current sequence with the instantaneous value of the voltage sequence provides an instantaneous power sequence that can be used to verify that the actual power delivered to the vacuum chamber is that delivered by the power supply. Such a sequence can be used to determine, for example, that a cable breakdown is occurring, shunting current around the vacuum chamber. Another example of the use of these sequences is that they can be used as an independent means to estimate the rotational speed of the steering magnet. As described above, it has been observed that the chamber voltage and current vary periodically with the steering magnet period as the chamber impedance varies due to geometric and other considerations. In one example, the scaled voltage or current sequence is passed through a digital high pass filter to remove the DC component. The resulting AC sequence is then tracked by a digital phase locked loop, from which the rotational frequency of the steering magnet is estimated. In another example implementation, a discrete Fourier transform is applied to the voltage or current sequence, and the magnet rotation frequency determined from the resulting spectrum. If the estimated rotation speed differs significantly from the expected rotation speed, a mechanical or electrical problem may be the cause. This information can be used to detect an incipient fault in the mechanical or electrical system.

According to another example embodiment of the present invention, the components and operation described above are replicated for monitoring multiple chambers or for detecting ARCING based upon additional threshold values applied to a single chamber voltage and current signals. In a particular example embodiment, four independently operating ADU functions controlled by a single DSPC 630 are provided. The four chamber version of the ADU can be configured to simultaneously monitor four independent chambers via four PSIMs, or a single PSIM can drive multiple ADU chamber inputs by wiring the corresponding VPSIM+, VPSIM−, IPSIM+ and IPSIM− ADU input signals for multiple chambers in parallel. In an example embodiment, when all four ADU functions are monitoring a single chamber via a single PSIM and wired in this manner, four different threshold values can be programmed for a single chamber. A count of number of arcs and arc duration at each programmed threshold value is maintained by the combination of corresponding Programmable Comparator 620 and ADLU 640. In the embodiment, DSPC 630 has access to all four ADLU functions, and arcing conditions can be resolved into one of four levels corresponding to the four independently programmed thresholds.

For instance, in a system employing four independent monitors attached to a single PSIM per above, and voltage threshold magnitudes programmed at 100, 200, 300 and 400 volts, a single arc having a minimum voltage magnitude of 250 volts will appear on the monitors with thresholds programmed at 300 and 400 volts, but not on those programmed at 100 and 200 volts. Furthermore, if the system is capturing a single arc in this manner, the period over which the chamber voltage collapses below the 300 volt level will appear simultaneously in the ADLU arc time counters corresponding to the 300 and 400 volt level, while the period over which the chamber voltage collapse is between 300 and 400 volts will appear only on the ADLU arc time counter corresponding to the 400 volt level. The arc event can then be resolved into two arc times—the arc time spent between 200 and 300 volts, read directly from the arc time counter of the ADLU corresponding to the 300 volt threshold, plus the arc time spent between 300 and 400 volts, computed by taking the difference between the ADLU arc time counters corresponding to the 400 volts and 300 volts respectively. This algorithm can be repeated as required for other arcs of different intensities.

In one particular example implementation, DSPC 630 samples the four ADLU register sets at a 10 kHz rate and communicates the arc count and arc time count for all four channels via High Speed Communication Interface 70 to Logic Arrangement 60. DSPC 630 also samples and transfers the nominal, filtered chamber current ICH, and filtered chamber voltage VCH to Logic Arrangement 60, which performs the mathematical operations required to resolve the arc per above and compute an estimate of arc energy. All four arc voltage threshold values can be computed adaptively by extension of the discussion above. In another example embodiment, DSPC 630 performs the computations internally, transmitting the resulting estimate of arc related parameters, such as arc time at each threshold value, and estimated arc energy to Logic Arrangement 60.

According to one example implementation, the logic arrangement 60 is an external logic arrangement, for example a programmable logic controller (PLC), tophat, or similar computing device. According to a more particular embodiment, the logic arrangement 60 is a Schneider Automation M1-E PLC. According to one aspect of the present invention, the ADU is incorporated into a Momentum form factor and adapted to communicate with Momentum tophats and programmable logic controllers (PLCs).

In one implementation, the data collected by the logic arrangement 60 is recorded. Software running on the logic arrangement 60 logs data, graphs data, and can provide network-based alarms responsive to the data. A system controller provides real-time control of the plasma generation application. When the arc count and/or arcing duration exceeds a selected quantity per deposition, the logic arrangement 60 determines according to a pre-defined algorithm that the arcing is damaging the substrate during material deposition, and communicates with the system controller to terminate the deposition. The logic arrangement 60 can also indicate that the substrate being processed will have reduced yield due to the arcing.

In addition to counting arcs and the cumulative duration of arcing for each deposition, the logic arrangement 60 is used to perform other real-time analysis of arc information in other implementations. For instance, analysis such as recording the total number (and duration) of arcs for the target, recording the arc intensity (referring to the proximity to ground potential, indicative of a direct short), and detecting continual arcing, which indicates a potential defect in the target requiring complete tool shut down for repair. In another implementation, a system controller provides a signal based on arcing rates, on arcing durations, on rate of change of arc rate/durations, or based on arc "quality," arc quality being proportional to duration, quantity and arc intensity (i.e., magnitude) or severity (as measure for example, by a product of the arc duration and magnitude).

According to another example embodiment of the present invention, a method integrates an arc detector with hardware necessary to inform a user, in real-time, that there is a problem with the sputtering source and that the newly-processed wafer may have reduced yield. Accordingly, various embodiments of the present invention can be realized to provide arc detection in other plasma generation control applications, such as for case hardening steel, among others. Generally, the circuit arrangements and methods of the present invention are applicable wherever a plasma generation chamber or its equivalent might be implemented.

Figure 27:
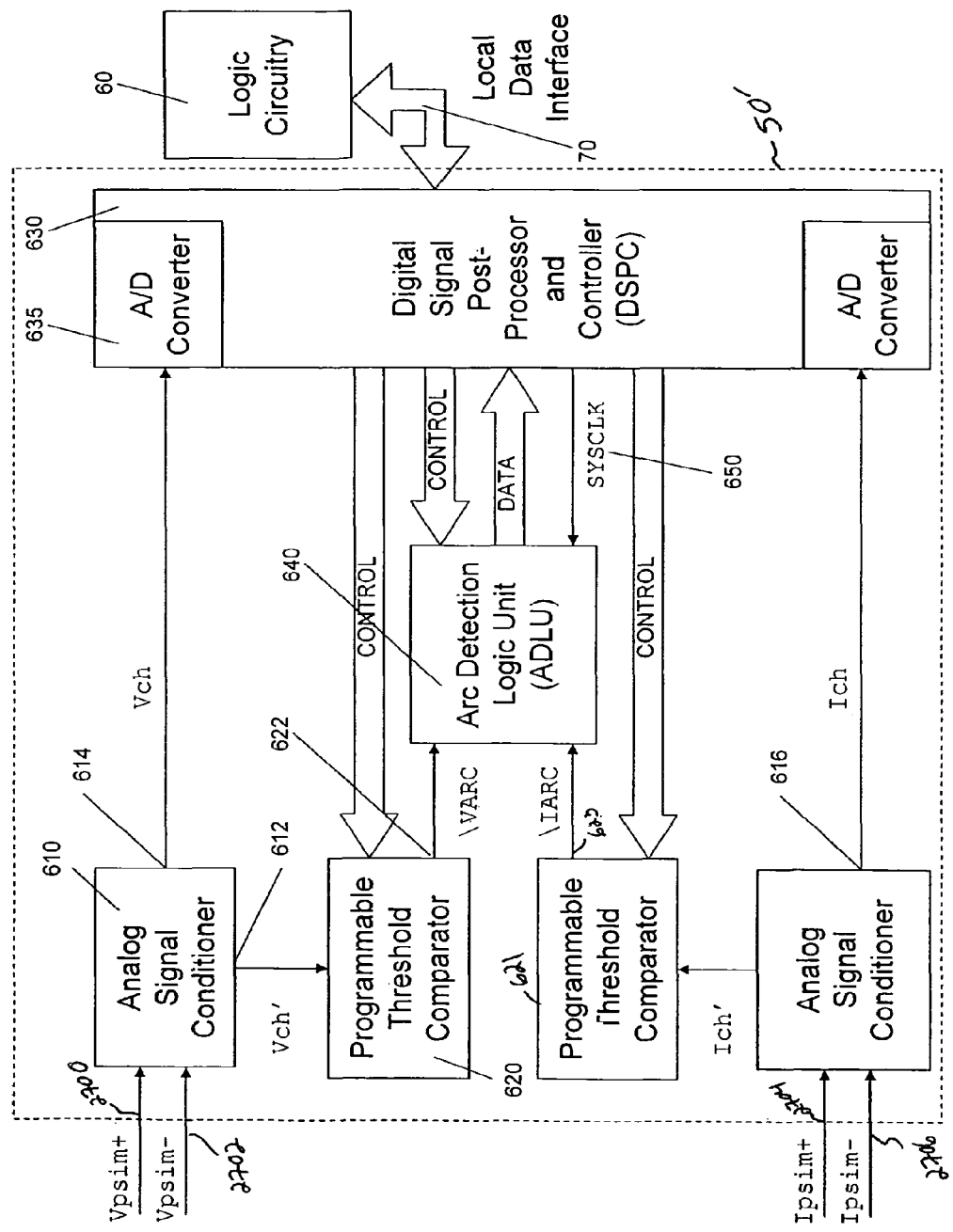

According to another embodiment of the invention, the arc detector unit 50' (as shown in FIG. 27) is configured to also detect arc events by observing spikes in the current supplied to a plasma generation apparatus 1300. Based on this information as well as arc event information from detection of voltage drops, the art detector unit 50' classifies the arc events into various classifications. The apparatus can also compute the scan energy and the arc energy for a particular classification of arc events. The basic arrangement of the components shown in FIG. 1, with the substitution of the ADU 50' of FIG. 27, is used to implement this embodiment.

Figure 13:
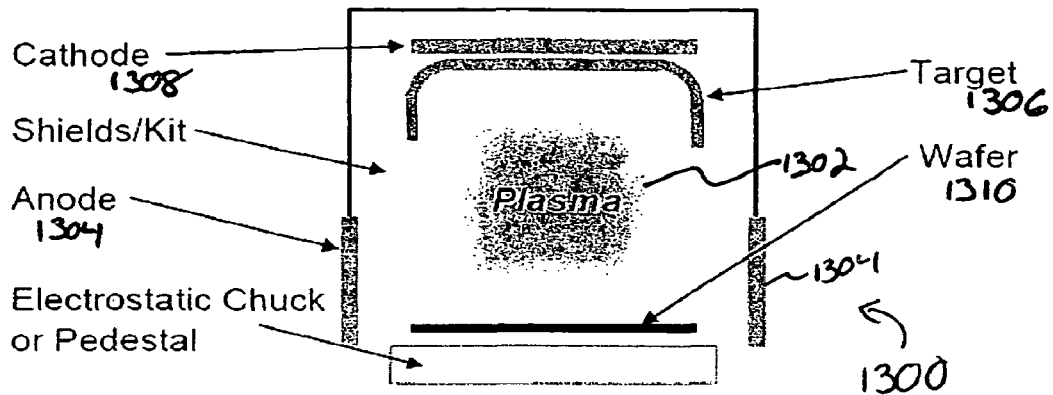
FIG. 13 is a graphical illustration of a cross-section of a PVD chamber configuration.

FIG. 13 illustrates a typical a basic chamber configuration of a plasma generation apparatus 1300 for a PVD process for depositing thin, highly uniform layers of a variety of materials onto substrates. A low-pressure gas, typically Argon, is ionized to form a plasma 1302 and accelerated from anodic surfaces 1304 (chamber walls and substrate) into a cathode-biased target 1306 of source material (the cathode is shown as 1308). The resulting atomic-level spray of target material coats all proximal surfaces, including the manufacturing substrate or wafer 1310. Typical anode-cathode voltages fall in the 300V-600V range (with spikes up to 1500V) while current ranges from 2 A to 100 A. The resulting power delivered to the chamber may be as low as a few kW and as high as 80 kW.

One major application of this process is the deposition of a metal layer on a silicon wafer substrate in the manufacturing of integrated circuits (ICs). As discussed above, this process is prone to "arcing." Arcing ejects macro-particle contaminants from the target. Some of this contaminant material can land on the wafer, causing product defects and nonuniformities in the coating that negatively affect manufacturer's revenues. Arcing may be caused by (i) target impurities or inclusions, (ii) target or kit aging and physical tolerance changes, or (iii) wafer alignment.

Arcing during the PVD process results from an unintended low impedance path from the anode to the target. When an arc occurs, the magnitude of the chamber impedance decreases rapidly, usually too fast for the power supply to respond. A rapid drop in the magnitude of voltage between the anode and cathode of the chamber can be observed. As a result, comparing the chamber voltage to a threshold value can provide early detection of arcs. Through such early detection, manufacturers can address root causes of arc generation without incurring excessive loss of revenue due to arc-generated defects.

Figure 14:
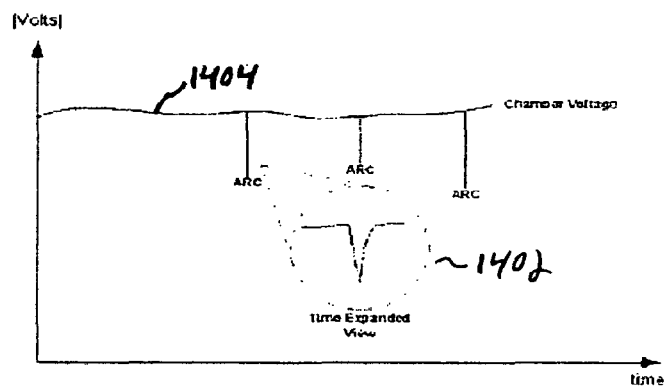
FIG. 14 is a plot of a typical PVD voltage signal with arcing events versus time.

As illustrated in FIG. 14, deleterious arcing conditions 1402 lasting on the order of 1 microsecond are often observed. These short duration arcs 1402 are commonly called micro-arcs. Due to the very short duration, detecting micro-arcs requires high-speed electronics. In addition to micro-arcs, macro-scale power supply events with duration on the order of milliseconds or tens of milliseconds also occur in PVD systems.

FIG. 14 shows a typical PVD chamber voltage 1404, plotted versus time. The magnitude of the voltage 1404 is shown because cathode voltage is negative relative to ground. Where there are arcs 1402, voltage suddenly and quickly decreases toward ground. Once the short-circuit event ends, voltage again returns to nominal chamber voltage. Not shown in the figure is possible overshoot and undershoot during recovery. Current responds similarly during an arcing event, though it rapidly increases, then decreases and may undershoot once the event ends and conditions return to normal.

The PSIM 40 is used to convert high-voltage and high-current readings from the power supply 30 into a 0-10V range for input to the ADU 50'. The 0-10V signals are linearly proportional to the chamber voltage and current. This provides a voltage signal indicative of the power supply 30 voltage, and a current signal indicative of the power supply 30 current.

Referring to FIG. 27, the ADU 50' is designed to monitor the 0-10V signals for high-speed transients, either up or down. Within the ADU 50', highspeed analog comparators 620, 621 determine whether a voltage signal has crossed a line. An internal logic unit 640 converts the analog comparator output 622, 623 into a logic-level value indicating whether the line has been crossed. Furthermore, it counts the number of logic unit clock cycles (i.e., duration) for which the line has been crossed, an indication of the severity of the arc.

The programmable logic controller (PLC) or other logic arrangement or circuitry 60, among its many functions, reads data from the ADU, converts DSP clock cycles into microseconds, resets arc counters, and makes the data available on ethernet. The PLC also sends command parameters to the ADU—when to look for arc events, what the threshold value is, whether the excursion should be above or below threshold, etc.

Figure 15:
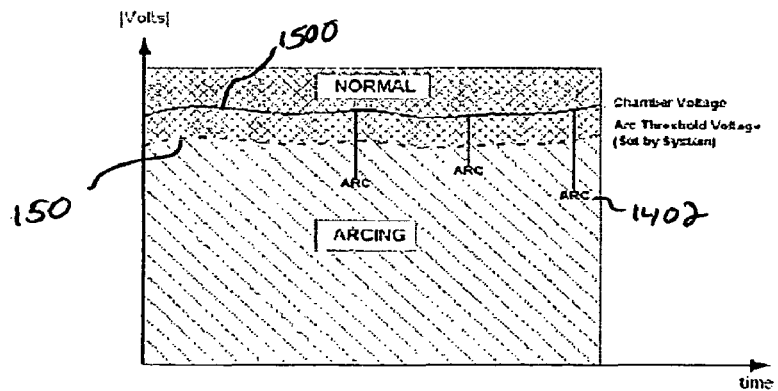
FIG. 15 is a plot of a PVD voltage signal in an arc detection unit of the present invention.

FIG. 15 depicts a typical chamber voltage magnitude 1500 vs. time, relative to a threshold level 1502. In the case of voltage, arcing conditions 1402 occur when the instantaneous voltage reading dips below the threshold value 1502. Note that the threshold 1502 is adaptive in that it does track slow changes in the chamber voltage 1500. The ADU 50' counts the number of times the threshold 1502 is passed, and the duration in terms of its 30 MHz clock cycles for which voltage is below threshold. To counter the effects of noise or bounce, an arc event does not end until the instantaneous voltage rises above the threshold 1502 plus a hysteresis value.

Figure 16:
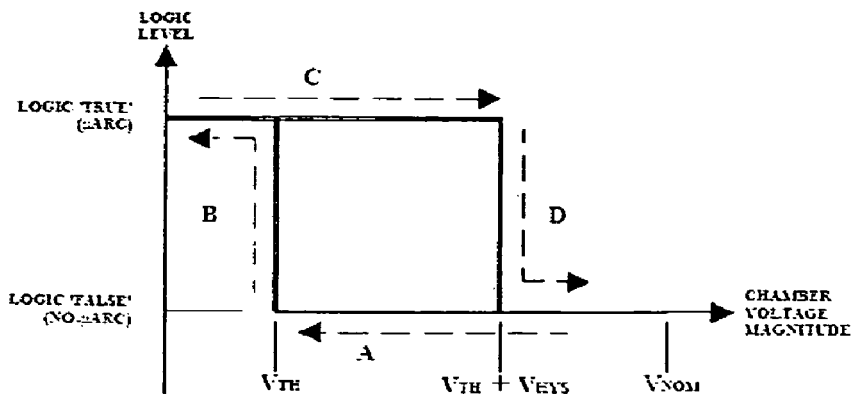
FIG. 16 is a logic level state transition diagram for the arc detection unit when it enters and exits an arcing condition.

FIG. 16 shows the state transition diagram for when the ADU 50' enters an arcing condition and when it exits the same condition. Following path A, voltage begins at a nominal value, VNOM. Once it falls below the threshold voltage, VTH, the ADU Logic Level transitions to TRUE, following path B. When voltage rises again in recovery back to nominal conditions, path C is followed. Once voltage crosses the threshold plus hysteresis barrier, VTH+VHYS, the ADU Logic Level transitions to FALSE, following path D. As time progresses, the chamber is at nominal voltage and the ADU awaits the next path A leading to transition B. Preferably, the hysteresis is a small fixed, hardware-determined value that cannot be adjusted through software. For the embodiment described, the value of hysteresis is approximately 6 mV on a scale of 10000 mV. However, for some embodiments, the hysteresis value can be set to zero.

The ADU 50' has four transient-monitoring (arc) channels, and four auxiliary channels. (The auxiliary channels may be used to record associated data but are not capable of counting arcs. The auxiliary channels are available for data collection in an upgraded system.). Referring to FIG. 27, a first arc channel is formed by the relative voltage difference between 2700 and 2702, and a second arc channel is formed between 2704 and 2706 (the remaining two channels can be used to monitor another voltage and current). The ADU 50' compares the PSIM signals to a threshold and reports excursions that are either above or below (as set by a control bit in the PLC logic), as described above.

Figure 17:
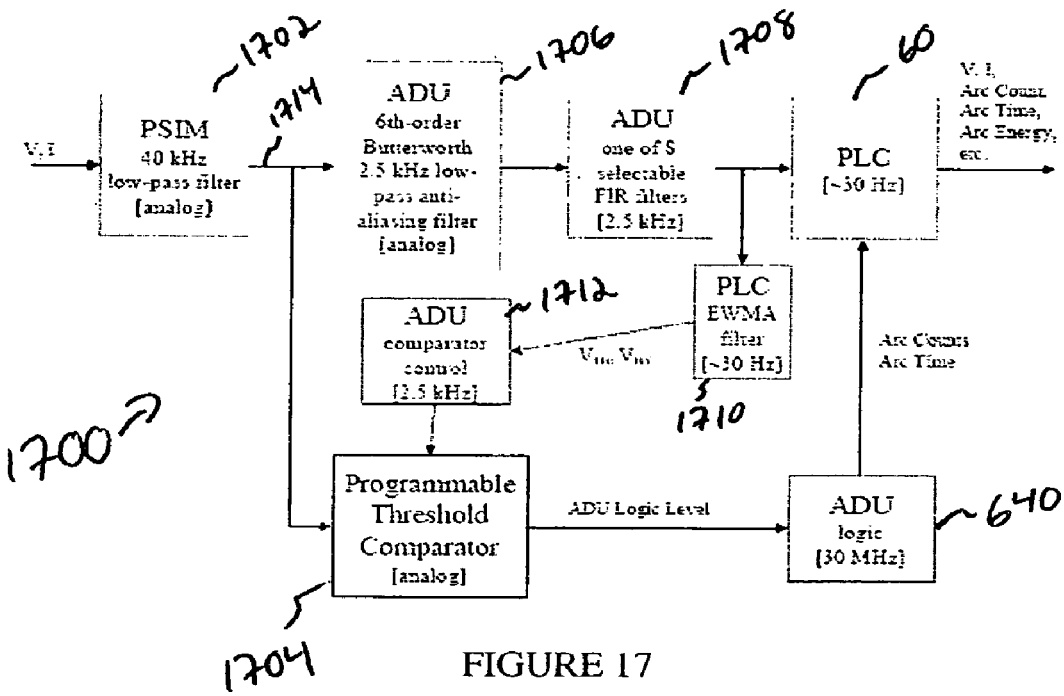
FIG. 17 is a block diagram of an arc channel signal propagation.

For the arc channels 2700/2702 and 2704/2706, signal propagation and filtering is as shown in FIG. 17. In FIG. 17, voltage V and current I as being delivered to the chamber by the power supply 30 and measured by the PSIM's transducers, are shown on the left side of the diagram entering the system 1700. Both voltage and current transducers have associated analog bandwidth, however both are several orders of magnitude in excess of the 40 kHz filter 1702 at the output of the PSIM 40, in place by design to mitigate the effects of switching noise from the DC power supplies. The 40 kHz cutoff is arbitrary and may be adjusted at the factory by changing output scaling resistors. This signal is fed directly into the analog Programmable Threshold Comparator 1704, which determines if there is a threshold violation or not in the form of the ADU Logic Level. A section of the ADU performing arc counting logic reads the ADU Logic Level from the analog comparator every 33 ns, or at the rate of 30 MHz. The PSIM V and I signals also propagate through an analog 6th order Butterworth filter 1706 whose purpose is to prevent signals from being aliased as they are fed into the digital sections of the ADU. The cutoff frequency of this filter is 2.5 kHz. The ADU then runs the V and I signals through a set of selectable FIR filters 1708. The default coefficients are set such that each of the eight filters is a moving average, with varying length. The PLC reads V and I as bandlimited, filtered signals, from which are calculated threshold values, at a rate of approximately 30 Hz. The basis for these calculations is an exponentially-weighted moving average (EWMA) filter 1710. These are fed back down through the ADU comparator controller 1712, operating at a configurable rate whose factory default setting is 2.5 kHz (this same controller performs the FIR filtering).

Preferably, the factory-standard PLC 60 used in this embodiment is a Momentum™ MIE 96030 processor. Signal connections to the ADU 50' (from the PSIM BNC connectors) are made with RG-178 coaxial cable via a standard 18 pin Momentum™ connector. The PLC 60 interfaces to the ADU 50' via a standard Momentum™ ATII hardware interface. The ATII interface supports 32 registers in each direction. The b32 registers are segmented into four identical groups of 8 registers, one for each channel.

The PLC 60 operates by the principle of scan cycles. During one scan cycle, the PLC 60 executes each of its instructions once and refreshes its I/O registers (through which it communicates with the ADU 50') once. Therefore, the PLC 60 controls the ADU 50' by first reading the 32 Status Registers and writing the 32 Command Registers, then running its own control program based on the newly-read data from the Status Registers. The PLC program contains logic that repeats four times, once per ADU channel (master voltage, master current, slave voltage, and slave current). The program also contains logic that is performed on each pair of channels (master and slave) because it incorporates data from both channels (current and voltage) per power supply.

When the PLC 60 reads the Status Registers (8 registers per ADU channel) from the ADU 50', the PLC program relies on four primary pieces of data per ADU channel. The four variables are the Status Register (in particular, bit 9, whether or not the ADU is at that moment measuring an arc), PSIM Signal, Arc Counts, and Arc Time. Note that the PSIM Signal 1714 (as shown in FIG. 17) is a 64-point moving average (which at 2.5 kHz constitutes a 25.6 ms window) of the actual chamber voltage or current which has also been bandlimited by two lowpass analog filters, the first with cutoff frequency at 40 kHz and the second with cutoff frequency at 2.5 kHz.

Figure 18:
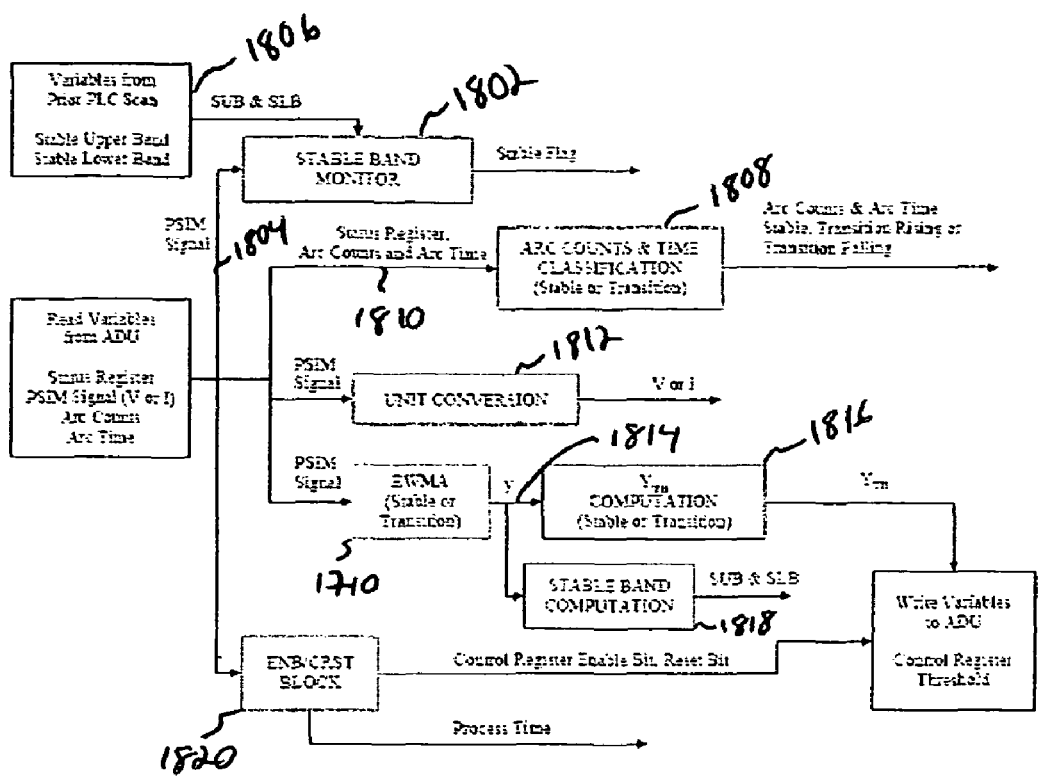
FIG. 18 is a block diagram of a PLC program main control.
Figure 19:
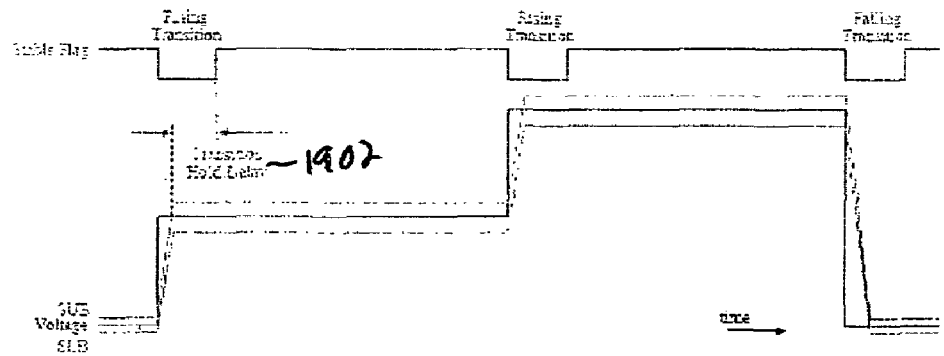
FIG. 19 is a plot of the stable band monitor variables versus time.

Referring to the block diagram of FIG. 18, a STABLE BAND MONITOR 1802 compares the latest PSIM Signal 1804 to the Stable Upper Band (SUB) and Stable Lower Band (SLB) values 1806. If the PSIM Signal 1804 falls above SUB, the system views that as indication of a step increase and the logic processes in the Rising Transition mode. If the PSIM Signal 1804 is less than SLB, the assumption is that the power supply is shutting off or decreasing power, and the program operates in Falling Transition Mode. If PSIM Signal 1804 falls within the range defined by SUB and SLB, the operating mode is Stable (unless waiting for the Transition Hold Delay to expire). When the system goes into one of the two Transition modes, it remains in the Transition mode for the Transition Hold Delay period of time beyond when PSIM Signal 1804 again falls within the SUB and SLB limits. As soon as PSIM Signal 1804 falls out of the range bounded by SUB and SLB, the Stable Flag falls from logic true (value 1) to logic false (value 0), whether the system enters Rising Transition or Falling Transition mode. The Stable Flag remains at logic false until PSIM Signal 1804 falls within the SUB-SLB range and remains there for the full Transition Hold Delay. As will be described in more detail below, SUB and SLB are calculated based on the EWMA-filtered version of PSIM Signal as seen by the PLC (adding yet another filter to the voltage or current reading). The filter will track changes in PSIM Signal slowly in Stable mode and more quickly in either of the two Transition modes. The time evolution of Stable Flag, SUB and SLB, along with notation of Transition Hold Delay 1902 are shown in FIG. 19 relative to two sequential power steps, the second greater than the first. Note that the STABLE BAND MONITOR 1802 is a mechanism to separate inevitable end-of-step arc counts and time (on the voltage channels where threshold is below) from true arc counts and time.

The ARC COUNTS & TIME CLASSIFICATION logic section 1808 takes the latest Arc Counts and Arc Time readings 1810 from the ADU 50' and if new Arc Counts and Arc Time have appeared, adds them to one of the three PLC Arc Counts and Time categories (only if status bit 9 of the Status Register must read logic false, indicating that the ADU 50' was not between beginning and ending of an arc). The three categories are Stable, Transition Rising, and Transition Falling. If the Stable Flag is logic true, new Arc Counts are added to the Stable Arc Counts total and new Arc Time is added to the Stable Arc Time total. If the Stable Flag is logic false, the PLC 60 tracks whether the Transition is Rising or Falling. Depending on which Transition is occurring, Arc Counts and Arc Time are added to the appropriate Arc Counts Transition and Arc Time Transition totals, either Rising or Falling.

It is important to note that the reason for Stable and Transition modes is that the present system does not know beforehand when a power supply step change or shut-down will occur. Because the ADU 50' is looking for arcs on the voltage channels as points where voltage drops below a threshold, it will always generate an Arc Count and some Arc Time until the next PLC scan cycle when it can reduce the threshold or disable the ADU 50' from counting arcs. Arc Time from power-down events is typically much greater than Arc Time during true microsecond arc events. Therefore, without a priori recipe or step duration information, the PLC 60 goes into Transition mode and separates Arc Time found during Transitions from Arc Time found during Stable processing. The Transition Hold Delay 1902 is intended to provide a blanking period during which plasma ignition transients may settle down. The Transition Hold Delay 1902 parameter and the Transition modes are methods of reducing false positives in the data.

A Unit Conversion section 1812 simply multiplies the PSIM Signal by the corresponding Calibration Constant and Calibration Percent values to convert the 0-10000 mV PSIM Signal into real-world engineering units of Volts or Amps (e.g., 0-10V as discussed above). The Calibration Constant parameter is a function of the PSIM hardware and should only be changed if the PSIM voltage divider resistors change or if the current transducer and its gain change. The Calibration Percent parameter is intended to be adjusted if it is desired to match voltage and current (or power) readings with similar readings from a different source, from the PVD equipment itself or other components.

The EWMA filter 1710 provides a method to track the PSIM Signal. The output 1814 of the EWMA filter is used to adjust Threshold, SUB, and SLB. In Stable mode, the tracking is slow so that the four adjusted parameters may slowly adapt to drifts or slow changes in the PSIM Signal setpoint. In Transition mode, the tracking is faster because the setpoint has changed and the PSIM Signal is quickly ramping up or down in order to achieve the new setpoint level. The equation governing the EWMA filter is given by $$y(k)=\lambda/100*\text{PSIM Signal}(k)+(1-\lambda/100)*y(k-1) \qquad (1)$$

where y is the is the value at the output of the filter, k is the PLC scan cycle index (each time the PLC begins a new scan, k increments by 1), and $\lambda$ is the filter coefficient. If the Stable Flag is logic true, $\lambda$ is the Stable Filter Coefficient. If the Stable Flag is logic false, $\lambda$ equals the Transition Filter Coefficient. Note that $\lambda$ may take a value between 0 and 100, representing a percentage level. The closer $\lambda$ is to 100, the more the most recent reading, PSIM Signal(k), affects the filter output, y(k), and the filter more quickly tracks a rapidly changing voltage or current level. The closer $\lambda$ is to 0, the less the most recent sample of PSIM Signal affects y(k), the more the exponentially decaying average of previous samples of PSIM Signal determine y(k), and the filter will very slowly follow a step change in the PSIM Signal. Note that PSIM Signal is interpreted such that both voltage and current are positive quantities (i.e. chamber voltage, while measured from cathode to anode, is an absolute value quantity rather than a negative value).

A YTH AND YHYS COMPUTATION section 1816 takes the output of the filter 1710, y, and calculates the threshold value to write to the ADU 50' in the next read/write phase of the PLC scan cycle. The threshold level is equal to y multiplied by the appropriate percentage as determined by the Stable Flag, either Stable Threshold Percentage or Transition Threshold Percentage.

In a STABLE BAND COMPUTATION 1818, the output of the EWMA filter 1710, y, is multiplied by the Stable Band Percentage and then added to y to result in SUB and subtracted from y to yield SLB. If the product of y and Stable Band Percentage is less than Stable Band Minimum (SBM), then SBM is added to y and subtracted from y to generate SUB and SLB, respectively.

A ENB/CRST BLOCK 1820 performs three functions: (1) tells the ADU 50' whether or not to look for arcs, (2) resets the ADU 50' at the end of the wafer 1310, and (3) keeps track of overall process time. To perform the first function, the ENB/CRST BLOCK 1820 sets the ADU Control Register Enable bit, ENB (Bit 1) to high when PSIM Signal is greater than the Enable Level. The ENB bit is set to low as soon as PSIM Signal is less than Enable Level. The second function is to reset the ADU 50', which is done when the ADU 50' is not enabled for a time that reaches the Reset Delay. In most PVD processes, the time between wafers 1310 exceeds the time of recipe steps during wafer processing where the power supplies are off. Therefore, to appropriately reset the ADU 50' between wafers 1310, the Reset Delay should be set to a value (in seconds) greater than intra-recipe power-off times, and less than between-wafer power-off time. The third function is that of tracking total process time, from first power-on to last power-off. After the aforementioned sections of logic are completed (and the other logic sections as well, though they do not affect any of the variables written to the ADU 50'), Threshold and Control Register are written to the ADU 50' in the next read/write phase of the scan cycle.

Figure 20:
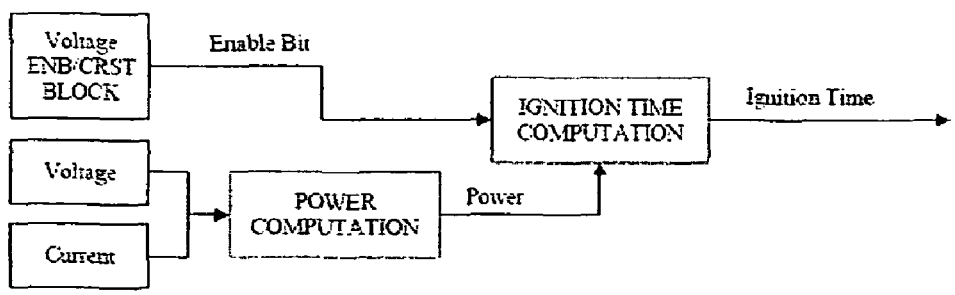
FIG. 20 is a block diagram of the power and ignition logic.

Additional logic performed by the PLC 60 is shown in FIG. 20 and FIG. 22. It is shown that the system computes Power for a power supply (master or slave) from the voltage and current readings that result from the UNIT CONVERSION logic for the individual channels. Additionally, Ignition Time is calculated by measuring the time difference between Voltage Enable and when Power rises to 90% of the Power Setpoint. In FIG. 21, Ignition Time is pictorially represented versus time relative to voltage and its enable level, current, power and its 90% power setpoint level.

FIG. 22 depicts the final section of logic. This section looks at the arc statistics for a single power supply (master or slave) and classifies the arcs into one of five classes, as described in the Table of FIG. 23.

Arc Counts and Time from the Voltage channel 2202 and Current channel 2204 are fed into the ARC CLASSIFICATION logic section 2206. If Arc Counts on both Voltage and Current channels 2202, 2204 show an increase since the last PLC scan, regardless of their corresponding Arc Times (and the ARC bit, Status Register, Bit 9 is not high), the PLC 60 increments the Arc Class 1 counter and calculates Scan Energy given by $$\text{Scan Energy}(k)=[y_v(k)-Y_{VTH}(k)]*[Y_{ITH}(k)-y_I(k)]* [t_{arcV}(k)+t_{arcI}(k)]/2 \quad (2)$$

where k is the PLC scan cycle index, yV is the EWMA filter output for the voltage channel, YVTH is the Threshold value for the voltage channel, yI is the EWMA filter output of the current channel, YITH is the Threshold value for the current channel, tarcV is the Arc Time for the voltage channel (for the latest PLC scan rather than cumulative), and tarcI is the Arc Time for the current channel (again for the latest PLC scan). Scan Energy is essentially the product of the area under the voltage curve and the area under the current curve where they deviate from their nominal (or EWMA-filtered) values. The time factor in the Scan Energy calculation is the average of the time seen on the two channels. Arc Energy is the cumulative sum of Scan Energies. If only Voltage Arc Counts have changed since the last scan, the Arc Time is checked relative to a boundary at 500 μs. (This boundary is hard-coded in the PLC). If Arc Time is less than the boundary value, the Arc Class 2 counter is incremented. If Arc Time is greater than or equal to the boundary value, the Arc Class 3 counter is incremented. If only Current Arc Counts register since the last PLC scan, Arc Time is checked and the Arc Class 4 or Arc Class 5 counter is incremented, depending on whether the Arc Time is less than the boundary or greater than or equal to the boundary value, respectively. The physical interpretation of each of the five classes is given in FIG. 23. Arc Energy and all five of the Arc Classes are reset at the end of the wafer.

Figure 24:
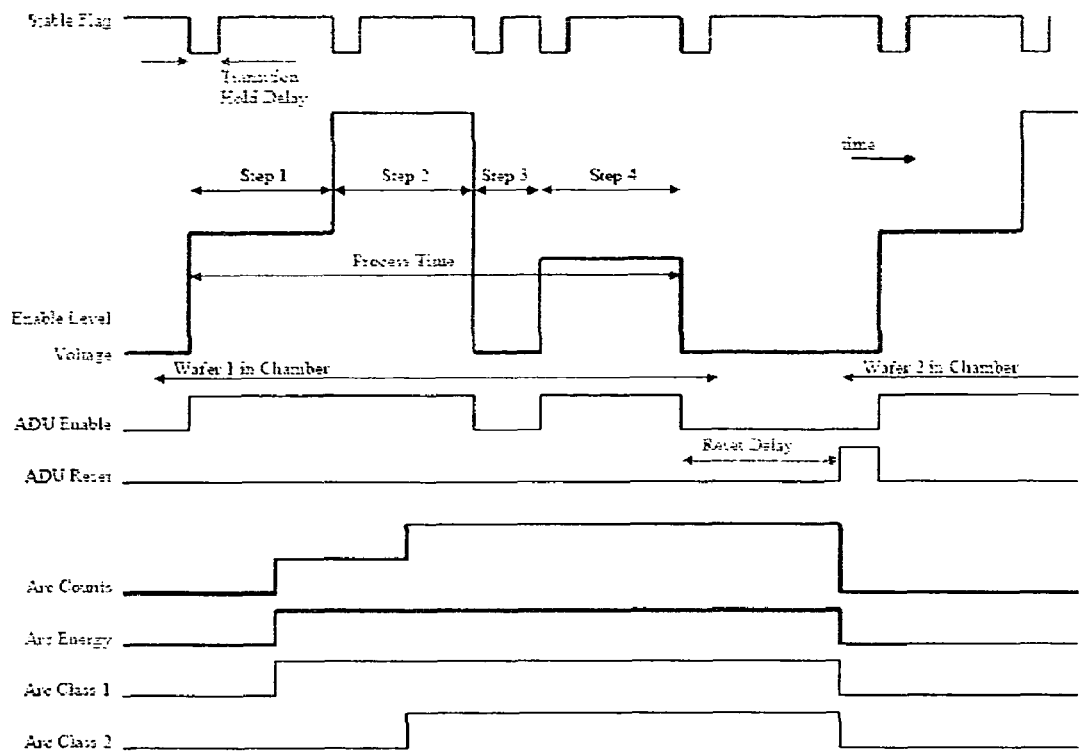
FIG. 24 is a wafer process arc variable timing diagram.

To summarize how the PLC program functions, a timing diagram is given in FIG. 24. A 4-step process (relative to power supply voltage) is shown, for one complete wafer (Wafer 1) and the beginning of the next wafer (Wafer 2). The first step has voltage on at a moderate level, the second step is the high-voltage step, the third step has power off, and the fourth step has the lowest voltage of the three power-on steps. The overall Process Time, as counted by the sensor, is from the beginning of the first step to the end of the fourth step. Note that Wafer 1 enters the chamber before Step 1 begins and exits the chamber a short time after Step 4 ends. When voltage transitions from one level to the next, the PLC 60 sees a large step change (in excess of the Stable Band), and places the system into Transition Mode, dropping the Stable Flag from logic true to false. The Stable Flag remains false, and the system in Transition Mode, until a time equal to the Transition Hold Delay after the voltage stabilizes in the new Stable Band. The purpose of this delay is to (1) avoid counting ignition transients as Stable Arcs, and (2) to accelerate tracking of the process voltage level (which affects how fast the Threshold level follows the process) so that once stability is achieved, the Threshold voltage is at the desired level. Though it is not shown in FIG. 3.4.6, the system differentiates between Rising and Falling Transitions. The ADU 50' is Enabled as shown by the ADU Enable bit which is high at all times when Voltage exceeds the Enable Level. A limited set of data is shown by the Voltage Arc Counts, Arc Energy, Arc Class 1 and Arc Class 2 traces at the bottom of the figure. In the middle of Step 1, Arc Counts on both Voltage and Current (not shown) channels occur at the same time (within the same PLC scan), therefore, Voltage Arc Counts are shown to increase, as is Arc Class 1. Correspondingly, Arc Energy increases per the calculation in (2). In the middle of Step 2, another arc event occurs, this one on the Voltage channel only. With Arc Time (not shown) less than 500 μs, the event registers as an Arc Class 2 event. Note how Arc Counts is a cumulative sum of Arc Counts since the beginning of the wafer. When the power supply is off for the Reset Delay duration, ADU Reset goes high and all of the arc-event related variables reset. Variables that reset that are shown in FIG. 24 are Arc Counts, Arc Energy, Arc Class 1 and Arc Class 2. When Wafer 2 begins (as seen by the sensor as the first increasing voltage transition), ADU Reset returns to logic false and ADU Enable becomes logic true.

Figure 25:
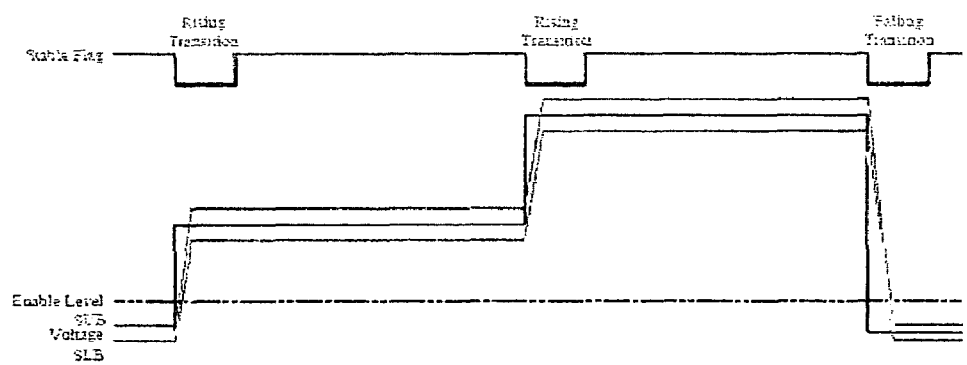
FIG. 25 is a wafer process threshold timing diagram.

Lastly, the adaptation of Threshold relative to process Voltage is shown in FIG. 25. At the beginning of the Diagram, Voltage is off (reading very close to zero) and Threshold, being Stable Threshold Percent*EWMA filter output, is also very close to zero (with the ADU not Enabled, it does not matter where the Threshold is as the ADU 50' is not counting arcs). SUB and SLB are above and below Voltage and probably governed by the Stable Band Minimum rather than by the Stable Band Percentage. When Voltage increases for the first time, the system enters a Rising Transition Mode, applying the Transition Filter Coefficient and the Transition Threshold Percentage. With the Transition Filter Coefficient being a larger value, the EWMA filter places more weight on the most recent sample of PSIM Signal, therefore the Threshold rises quickly in response to the step change in Voltage. Once Voltage stabilizes, so does Threshold, at the level prescribed by the Transition Threshold Percentage. After the process Voltage falls within SUB and SLB for a period of time equal to the Transition Hold Delay, the system reverts to Stable Mode where Stable Threshold Percentages and Stable Filter Coefficients apply. The switch from Transition Mode to Stable mode is accompanied by a jump in Threshold where the Threshold Percentage switches from Stable to Transition. A similar progression is seen at the second Rising Transition in Voltage. The progression again repeats at the Falling Transition when the Voltage drops to an off state, with the only difference being that any Transition Arc Counts and Time generated in this period are logged as part of Falling Transition arc event statistics.

In stand-alone mode, where the system has no information as to when process transitions occur, it is normal to see Falling Transition Arc Counts and Time on the Voltage channels. It is also normal to see Rising Transition Arc Counts and Time on the Current channels. In both cases, the signals suddenly move in the direction in which the ADU 50' is looking for sudden transients. Until the PLC 60 (at 30 Hz) can catch up with the ADU 50' (30 MHz) and give the command to change threshold, the ADU 50' will count step changes as arcs. Hence the need to separate data into Stable and Transition components.

System parameters should be adjusted such that Arc Counts, Arc Time, Arc Energy, Arc Classes, Process Transitions, Ignition Time and Process Time data (and the rest of the Output Data, but the aforementioned set comprises the critical data points) are all being optimally reported by the system. The goal is to capture data for "true arcs" that affect wafer quality.

Figure 26:
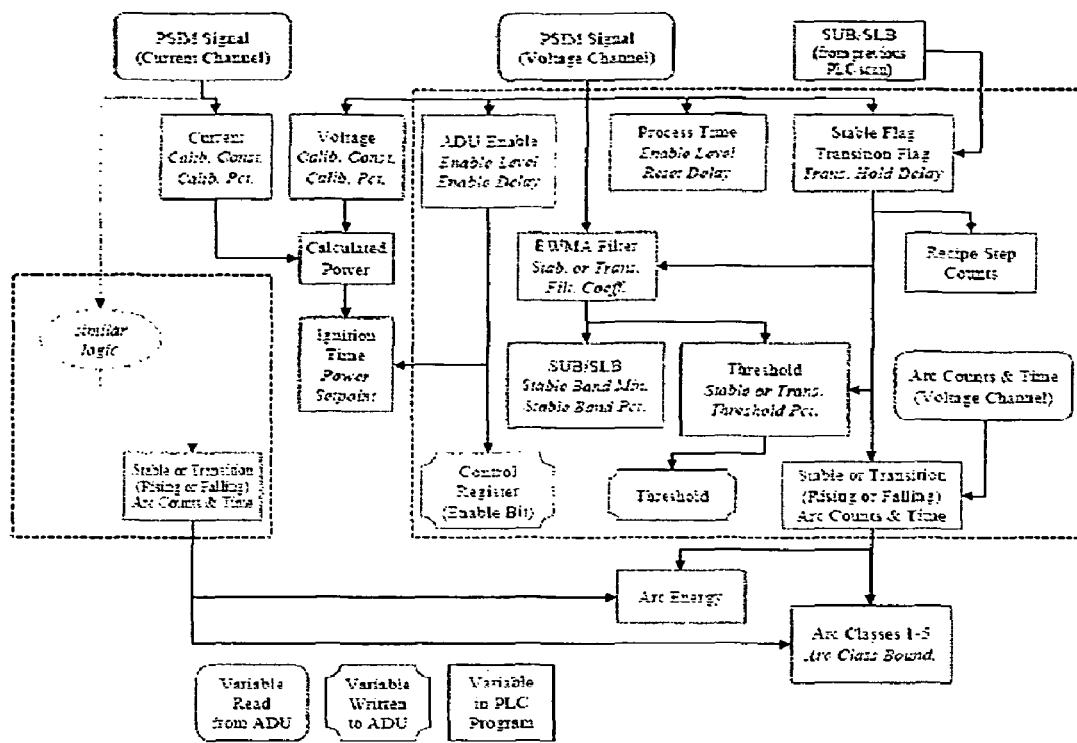
FIG. 26 is a block diagram of an arc detection order of execution of logic, and, FIG. 27 is a block diagram illustrating another example implementation of an arc detector unit portion of an arc detection arrangement, according to the present invention.

The various variables and parameters involved in the system are graphically illustrated in FIG. 26. The two most important variables are Threshold and Stable Flag. Arc Counts, Arc Time, Arc Energy, and Arc Class variables all depend on Threshold. If Threshold is too close to the operating voltage or current, the system will report false-alarm arc events. If Threshold is too far away from the operating voltage or current, the system may miss reporting some of the shorter micro-arcing events. Stable Flag affects Threshold in two ways, through the selection of Threshold Percentage (Stable or Transition) and by adjusting the bandwidth of the EWMA filter, the output of which feeds directly into the Threshold calculation.

FIG. 26 discloses several paths of logic, the Power and Ignition Time path, the ADU Enable path, Threshold path, the Process Time path, and the Stable Flag/Arc Counts/Arc Energy/Arc Class path. The starting point of each of the paths is one or more values read from the ADU (read-from) Registers. The ending point for each path will be one or more values to write to the ADU (write-to) Registers or a system variable statistically descriptive of one or more arc events. Note that in FIG. 26, because Current Channel logic follows the same structure and flow as that of the Voltage Channel logic, it is shown graphically abbreviated. The similar sections are bounded by a rectangular dashed line.

In the Power and Ignition Time path, voltage and current for the master power supply PSIM (or the slave) are combined to yield Calculated Power, which is in turn used to calculate Ignition Time. The parameters used in the calculation of each variable are shown in italics in FIG. 26. Both Current and Voltage result from multiplying PSIM Signal by Calibration Constant and Calibration Percentage. Ignition Time is the result of the time difference from when ADU Enable goes high until Calculated Power rises above 90% of Power Setpoint. Calibration Constant and Calibration Percentage are used to adjust Current and Voltage. Calibration Constant reflects PSIM hardware, therefore should not be changed unless PSIM hardware is changed. Calibration Percentage is only to be adjusted if Current or Voltage need fine-tuning to match data from another source in the fab, such as from the tool controller. Power Setpoint should be adjusted such that it is equal to the power level of the first step in the recipe (in Watts). (Ignition Time may be calculated for each step in the recipe, however the PLC program will have to be modified from the version described in this document.)

The ADU Enable path determines when the ADU is actively looking for arcs. It is controlled by the Enable Level and Enable Delay parameters. When PSIM Signal rises above Enable Level, the PLC will command the ADU 50' to begin looking for arcs by setting the Enable Bit in the Control Register. Enable Level should be above the off-state reading and below the lowest Voltage or Current level (in equivalent PSIM Signal units) seen in the recipes run by the PVD tool. Enable Delay may be increased if it is desired to keep the ADU 50' inactive for a time period after PSIM Signal rises above Enable Level. Practically speaking, the Enable Level condition (combined with the Stable vs. Transition modes) is sufficient in and of itself, therefore Enable Delay will likely never need to be adjusted in PVD applications.

In the Threshold path, PSIM Signal is fed into an EWMA filter governed by Stable Filter Coefficient or Transition Filter Coefficient, as determined by the state of Stable Flag. The Filter Coefficient parameters may vary from 0 to 100. High values increase the bandwidth of the filter which permits quick-response tracking of step changes (yet poor noise rejection). When in steady-state, or during Stable Mode, the system should be set to have a Threshold (remember Threshold=Threshold Percentage*Filter Output) where noise in the Threshold coupled with noise in the DC Power Supply signal will not lead to false arc counts.

The output of the Filter is then fed into the Stable Upper Band/Stable Lower Band (SUB/SLB) calculation where the Filter Output is multiplied by the Stable Band Percentage. If this product is less than the Stable Band Minimum parameter, then Stable Band Minimum is added to and subtracted from Filter Output to yield SUB and SLB, respectively. Otherwise, the product is added to and subtracted from Filter Output to give SUB and SLB. SUB and SLB are then used in the beginning of the next PLC scan to determine whether the Stable Flag is true or false. Stable Band Percentage should be low enough to ensure that the smallest step changes between recipe steps cause the system to enter Transition Mode, yet it should be high enough so that any power loss events that may be present do not cause the system to enter Transition Mode in the middle of what should be a single recipe step. Stable Band Percentage may initially be set from known recipe voltage and current profiles, but must be verified empirically by examining data from multiple wafer runs for each process. Stable Band Minimum should be set such that when the system is in power-off state, Stable Flag does not change back and forth between true and false. It may be set simply by observing off-state noise and tripling observed variation.

Filter Output is also fed into the Threshold calculation. The Stable Flag determines which mode applies, Stable or Transition. Threshold is then Filter Output multiplied by Stable Threshold Percentage or Transition Threshold Percentage. Threshold is one of the two most important variables in the data.

Threshold, through Stable Threshold Percentage, should be adjusted up and down during steady-state operation of the various process recipes and power setpoints to identify power supply ripple, keeping in mind that ripple will vary with time and from chamber to chamber. Stable Threshold Percentage must be set such that Threshold is well below power supply ripple, yet sufficiently high to capture short-duration arcs. Recall that the PSIM contains a 60 kHz filter in its circuitry (by design to mitigate the effects of power supply switching noise), for which the time constant is 2.6 µs. Given that voltage transients for true arcs take voltage from process setpoint to zero in much less than 1 µs, and assuming an arc may be represented by a square-wave function (two step changes of opposite direction and equal magnitude), the time constant and Stable Threshold Percentage will determine the shortest arc detectable by the system. For example, in figure 5.4, an arc of 3 µs is shown as Power Supply Voltage and bandlimited PSIM Signal, relative to Threshold. Even though the signal the ADU receives is bandlimited, the arc is still counted as an excursion beyond Threshold. By comparison, the arc that has been reduced to 1 µs is not counted by the ADU with a 60% Stable Threshold Percentage. However, it would be counted as an arc event if the Stable Threshold Percentage were set to 80%.

Therefore, Stable Threshold Percentage should be set well below the level where the ADU counts noise as arc events, yet not so low that a large percentage of true arc events do not cause PSIM Signal to cross Threshold. Transition Threshold Percentage should be set similarly, keeping in mind that ignition periods are inherently noisy, therefore its value will likely be less than that of Stable Threshold Percentage. Transition Hold Delay may be used to lengthen or shorten the period during which Transition Threshold Percentage applies.

In the Process Time path, the only calculation is that of Process Time itself. Process Time is the time from when PSIM Signal exceeds Enable Level to the point where PSIM Signal falls below Enable Level and remains below for at least a time equal to Reset Delay (Note that Reset Delay is subtracted from Process Time when it is exceeded so that Process Time reflects the difference between first ADU Enable true condition and last ADU Enable true condition for the wafer.). The system's reset logic may be replaced in the PLC program by a signal another device indicating that the wafer process has ended and that data may be reset, thereby rendering Reset Delay unnecessary.

Finally, the Stable Flag/Arc Counts/Arc Energy/Arc Class path contains the last two parameters, Transition Hold Delay and Arc Class Boundary. Stable Flag again is one of the two most important system variables. It is true if PSIM Signal falls within the range defined by SUB and SLB from the previous PLC scan. Otherwise, it is false and remains false until PSIM Signal again falls with the SUB-SLB range for the Transition Hold Delay period of time. Stable Flag affects the EWMA Filter, Threshold, and the binning of Arc Counts into Stable, Rising Transition and Falling Transition categories. To adjust Transition Hold Delay, adjust its value and compare all three categories of Arc Counts data during and immediately after Stable Flag is false. If Stable Arc Counts are occurring regularly immediately after Stable Flag becomes true at the beginning of the process or of a step, Transition Hold Delay should be increased.

While the specific embodiments have been illustrated and described, numerous modifications come to mind without significantly departing from the spirit of the invention, and the scope of protection is only limited by the scope of the accompanying Claims.

What is claimed is:

1. A method of detecting and classifying arcs in a physical vapor deposition process comprising:
   monitoring a power supply voltage and current of a plasma generation apparatus;
   detecting a plurality of instances when the voltage drops below a predetermined first voltage threshold;
   timing the duration of each instance the voltage drops below the predetermined first voltage threshold;
   detecting a plurality of instances the current spikes above a predetermined first current threshold;
   timing the duration of each instance the current spikes above the predetermined first current threshold; and
   identifying each instance the voltage drops below the predetermined first voltage threshold with and without a corresponding coincidental current spike and each instance the current spikes above the predetermined first current threshold with and without a corresponding coincidental voltage drop; and
   sending data for each of the identified instances.

2. The method of claim 1 further comprising the steps of:
   determining whether the voltage is in one of a stable mode, a rising transition mode and a falling transition mode.

3. The method of claim 2 further comprising the steps of:
   maintaining a count of arc events and corresponding durations occurring when the voltage is in a stable mode;
   maintaining a count of arc events and corresponding durations occurring when the voltage is in a rising transition mode; and,
   maintaining a count of arc events and corresponding durations occurring when the voltage is in a falling transition mode.

4. The method of claim 1 further comprising the step of:
   classifying arc events based on monitoring the power supply voltage and current of the plasma generation apparatus.

5. The method of claim 1, further comprising the steps of:
   for each of the identified instances where a voltage drop and a current spike are coincidental, assigning that identified instance a first classification;
   for each of the identified instances where one or more voltage drops without a corresponding coincidental current spike have a cumulative duration less than a predetermined time, assigning that identified instance a second classification;
   for each of the identified instances where one or more voltage drops without a corresponding coincidental current spike have a cumulative duration greater than a predetermined time, assigning that identified instance a third classification;
   for each of the identified instances where one or more current spikes without a corresponding coincidental voltage drop have a cumulative duration less than a predetermined time, assigning that identified instance a fourth classification; and,
   for each of the identified instances where one or more current spikes without a corresponding coincidental voltage drop have a cumulative duration greater than a predetermined time, assigning that identified instance a fifth classification,
   wherein sending the data comprises sending data that indicates the assigned classification of each of the identified instances.

6. The method of claim 1 further comprising the step of:
   calculating the scan energy for each of the identified instances having a first classification.

7. The method of claim 1 further comprising the steps of:
   disabling detecting a voltage drop below a predetermined first threshold for a transition hold period after each detection of a voltage drop below the predetermined first threshold; and,
   disabling detecting a current spike above a predetermined first threshold for a transition hold period after each detection of a current spike above the predetermined first threshold.

8. The method of claim 1 further comprising the step of:
   adjusting the predetermined first voltage threshold during a scanning cycle to track slow changes in the supply voltage.

9. The method of claim 1 wherein the duration of voltage drops and the duration of current spikes are measured in clock cycles.

10. The method of claim 1 further comprising the steps of:
    detecting each arc event instance where the voltage drops below a predetermined second voltage threshold;
    detecting each arc event instance the current spikes above a predetermined second current threshold.

11. A method of determining an arc event in a plasma generation apparatus comprising the steps of:
    monitoring a power supply current and voltage;
    detecting a voltage drop in the monitored voltage;
    determining whether a current spike in the monitored current coincides with the voltage drop;

determining that a first arc event type has occurred if it is determined that a current spike in the monitored current coincides with the voltage drop;

determining that a second arc event type has occurred if it is determined that a current spike in the monitored current does not coincide with the voltage drop, and sending data based on the event type.

12. The method of claim 11 further comprising the step of: calculating a scan energy associated with the voltage drop.

13. The method of claim 11 further comprising the step of: calculating an arc energy wherein the arc energy is a cumulative sum of a plurality of scan energies associated with a plurality of voltage drops in the monitored voltage.

14. A method for detecting arcs in a plasma generation apparatus having an interface configured to detect a voltage and current of a supply of power, the plasma generation apparatus being configured to create an ionized gas between a target and a wafer, the method comprising the steps of:

comparing the voltage to a voltage threshold value at a set frequency; and, comparing the current to a current threshold value at the set frequency;

first determining if an arc event occurred based on a first comparison of the voltage to the voltage threshold value and a first comparison of the current to the current threshold value; and second determining if another arc event occurred based on a second comparison of the voltage to the voltage threshold value and a second comparison of the current to the current threshold value, wherein responsive to the first determining that an arc event occurred, performing the second determining comprises delaying the second comparison of the voltage to the voltage threshold value and the second comparison of the current to the current threshold value for a transition delay period.

15. The method of claim 14, further comprising the steps of:

generating a power-related parameter;

comparing the power related parameter to at least one threshold to determine the severity of arcing in the plasma generation apparatus; and, measuring arc duration responsive to comparing the power related parameter to the at least one threshold.

16. The method of claim 14, further comprising sending data if an arc event is determined to have occurred.

17. An apparatus for detecting an arc event in a plasma generation chamber, the apparatus comprising:

a power supply interface module configured to detect a power supply voltage and current applied to the plasma generation chamber;

an arc detection unit communicatively coupled to the power supply interface module, the arc detection unit including a threshold comparator circuit arranged to compare the voltage to a first voltage threshold value and compare the current to a first current threshold value; and logic circuitry configured to make a determination of events based on an output of the threshold comparator circuit, to determine the duration of events based on the voltage dropping below the first voltage threshold value and the duration of an event based on the current spiking above the first current threshold value, and to classify events based on the output of the threshold comparator circuit and the duration of each event by:

for each of the events where a voltage drop and a current spike are coincidental, assigning that event a first classification, for each of the events where one or more voltage drops without a corresponding coincidental current spike have a cumulative duration less than a predetermined time, assigning that event a second classification, for each of the events where one or more voltage drops without a corresponding coincidental current spike have a cumulative duration greater than a predetermined time, assigning that event a third classification, for each of the events where one or more current spikes without a corresponding coincidental voltage drop have a cumulative duration less than a predetermined time, assigning that event a fourth classification, and for each of the events where one or more current spikes without a corresponding coincidental voltage drop have a cumulative duration greater than a predetermined time, assigning that event a fifth classification.

18. The apparatus of claim 17 wherein the threshold comparator circuit is programmable to enable a user to set an initial voltage threshold value and an initial current threshold value.

19. The apparatus of claim 17 wherein the logic circuitry is arranged to determined if the voltage is in one of a stable mode, a rising transition mode and a falling transition mode.

20. The apparatus of claim 19 wherein the logic circuitry is arranged to maintain a count of the events occurring when the voltage is in a stable mode, maintain a count of the events when the voltage is in a rising transition mode, and maintain a count of the events when the voltage is in a falling transition mode.

21. The apparatus of claim 17, wherein the logic circuitry is arranged to compute arc energy.

22. The apparatus of claim 17, wherein the arc detection unit includes a digital signal processor.

23. A method of determining an arc event in a plasma generation apparatus, the method comprising the steps of:

monitoring a power supply current and voltage;

detecting a current spike in the monitored current;

determining whether a voltage drop in the monitored voltage coincides with the current spike;

determining that a first arc event type has occurred if it is determined that a voltage drop in the monitored current coincides with the current spike;

determining that a second arc event type has occurred if it is determined that a voltage drop in the monitored current does not coincide with the current spike, and sending data based on the event type.

24. The method of claim 23, further comprising calculating a scan energy associated with the current spike.

25. The method of claim 24 further comprising calculating an arc energy, wherein the arc energy is a cumulative sum of a plurality of scan energies associated with a plurality of current spikes in the monitored voltage.

26. A plasma generation apparatus, comprising:

a power supply interface configured to monitor a power supply voltage and current of the plasma generation apparatus;

an arc detector configured to detect a plurality of instances when the voltage drops below a predetermined first voltage threshold and a plurality of instances when the current spikes above a predetermined first current threshold; and logic circuitry configured to:

time the duration of each instance the voltage drops below the predetermined first voltage threshold, time the duration of each instance the current spikes above the predetermined first current threshold, and identify each instance the voltage drops below the predetermined first voltage threshold with and without a corresponding coincidental current spike and each instance the current spikes above the predetermined first current threshold with and without a corresponding coincidental voltage drop.

27. The plasma generation apparatus of claim 26, wherein the logic circuitry is further configured to determine whether the voltage is in one of a stable mode, a rising transition mode and a falling transition mode.

28. The plasma generation apparatus of claim 27, wherein the logic circuitry is further configured to:
maintain a count of arc events and corresponding durations occurring when the voltage is in a stable mode;
maintain a count of arc events and corresponding durations occurring when the voltage is in a rising transition mode; and,
maintain a count of arc events and corresponding durations occurring when the voltage is in a falling transition mode.

29. The plasma generation apparatus of claim 26, wherein the logic circuitry is further configured to classify arc events based on monitoring the power supply voltage and current of the plasma generation apparatus.

30. The plasma generation apparatus of claim 26, wherein the logic circuitry is further configured to:
for each of the identified instances where a voltage drop and a current spike are coincidental, assign that identified instance a first classification;
for each of the identified instances where one or more voltage drops without a corresponding coincidental current spike have a cumulative duration less than a predetermined time, assign that identified instance a second classification;
for each of the identified instances where one or more voltage drops without a corresponding coincidental current spike have a cumulative duration greater than a predetermined time, assign that identified instance a third classification;
for each of the identified instances where one or more current spikes without a corresponding coincidental voltage drop have a cumulative duration less than a predetermined time, assign that identified instance a fourth classification;
for each of the identified instances where one or more current spikes without a corresponding coincidental voltage drop have a cumulative duration greater than a predetermined time, assign that identified instance a fifth classification; and
generate data indicating the assigned classification of each of the identified instances.

31. The plasma generation apparatus of claim 26, wherein the logic circuitry is further configured to calculate a scan energy for each of the identified instances having a first classification.

32. The plasma generation apparatus of claim 26, wherein the plasma generation apparatus is further configured to:
disable detecting a voltage drop below a predetermined first threshold for a transition hold period after each detection of a voltage drop below the predetermined first threshold; and
disable detecting a current spike above a predetermined first threshold for a transition hold period after each detection of a current spike above the predetermined first threshold.

33. The plasma generation apparatus of claim 26, wherein the plasma generation apparatus is further configured to adjust the predetermined first voltage threshold during a scanning cycle to track slow changes in the supply voltage.

34. The plasma generation apparatus of claim 26, wherein the duration of voltage drops and the duration of current spikes are measured in clock cycles.

* * * * *